(12) United States Patent
Kishimoto

(10) Patent No.: US 10,505,150 B2
(45) Date of Patent: *Dec. 10, 2019

(54) ORGANIC ELECTROLUMINESCENT DEVICE AND METHOD FOR PRODUCING SAME

(71) Applicant: Sakai Display Products Corporation, Sakai-shi, Osaka (JP)

(72) Inventor: Katsuhiko Kishimoto, Osaka (JP)

(73) Assignee: Sakai Display Products Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/295,907

(22) Filed: Mar. 7, 2019

(65) Prior Publication Data

US 2019/0207162 A1  Jul. 4, 2019

Related U.S. Application Data

(63) Continuation of application No. 15/756,858, filed as application No. PCT/JP2017/013267 on Mar. 30, 2017, now Pat. No. 10,276,830.

(51) Int. Cl.
*H01L 51/56* (2006.01)
*H01L 51/52* (2006.01)
(Continued)

(52) U.S. Cl.
CPC ............ *H01L 51/5256* (2013.01); *B05D 1/60* (2013.01); *G09F 9/30* (2013.01); *H01L 27/32* (2013.01);
(Continued)

(58) Field of Classification Search
CPC ............. H01L 51/3276; H01L 51/5253; H01L 51/5256; H01L 51/56;
(Continued)

(56) References Cited

U.S. PATENT DOCUMENTS

| 7,488,986 B2 | 2/2009 | Yamazaki |
| 8,105,954 B2 | 1/2012 | Wang |

(Continued)

FOREIGN PATENT DOCUMENTS

| JP | 2006-278004 A | 10/2006 |
| JP | 2007-250370 A | 9/2007 |

(Continued)

OTHER PUBLICATIONS

Decision to Grant for related Japanese Application No. 2017-566156 dated Feb. 6, 2018.

(Continued)

*Primary Examiner* — Eric A. Ward
(74) *Attorney, Agent, or Firm* — Renner, Otto, Boisselle & Sklar, LLP

(57) ABSTRACT

An organic electroluminescent device according to an embodiment includes an element substrate including a substrate and a plurality of organic electroluminescent elements supported by the substrate, and a thin film encapsulation structure formed on the plurality of organic electroluminescent elements. The thin film encapsulation structure includes at least one complex stack body which includes a first inorganic barrier layer, an organic barrier layer in contact with a top surface of the first inorganic barrier layer, the organic barrier layer including a plurality of solid portions discretely distributed, and a second inorganic barrier layer in contact with the top surface of the first inorganic barrier layer and a top surface of each of the plurality of solid portions of the organic barrier layer.

10 Claims, 16 Drawing Sheets

(51) Int. Cl.
*H01L 27/32* (2006.01)
*B05D 1/00* (2006.01)
*H01L 51/50* (2006.01)
*G09F 9/30* (2006.01)

(52) U.S. Cl.
CPC .......... *H01L 27/3276* (2013.01); *H01L 51/50* (2013.01); *H01L 51/56* (2013.01); *H01L 2227/323* (2013.01); *H01L 2251/301* (2013.01); *H01L 2251/5338* (2013.01); *H01L 2251/558* (2013.01)

(58) Field of Classification Search
CPC .......... H01L 27/32–27/3297; H01L 2227/323; H01L 2251/301; H01L 2251/5538; H01L 2251/558; B05D 1/60; B05D 3/06–068
See application file for complete search history.

(56) References Cited

U.S. PATENT DOCUMENTS

| | | |
|---|---|---|
| 10,018,920 B2 | 7/2018 | Chang |
| 2010/0187986 A1 | 7/2010 | Kajitani et al. |
| 2014/0264300 A1 | 9/2014 | Kamiya |
| 2016/0043346 A1 | 2/2016 | Kamiya et al. |
| 2016/0126495 A1 | 5/2016 | Oka et al. |
| 2019/0229287 A1* | 7/2019 | Kishimoto .......... H01L 27/3244 |

FOREIGN PATENT DOCUMENTS

| | | |
|---|---|---|
| JP | 2009-037812 A | 2/2009 |
| JP | 2010-055894 A | 3/2010 |
| JP | 2013-020893 A | 1/2013 |
| JP | 2013-064187 A | 4/2013 |
| JP | 2013-186971 A | 9/2013 |
| JP | 2013-247021 A | 12/2013 |
| JP | 2014-179278 A | 9/2014 |
| JP | 2015-176717 A | 10/2015 |
| JP | 2016-039120 A | 3/2016 |
| WO | WO 2012/053532 A1 | 4/2012 |
| WO | WO 2014/196137 A1 | 12/2014 |
| WO | WO 2018/003129 A1 | 1/2018 |

OTHER PUBLICATIONS

Allowed claims of co-pending U.S. Appl. No. 15/756,858, filed Sep. 13, 2018.

* cited by examiner (a)

(b)

(a)

(b)

(c)

(a)

(b)

(a)

(b)

(a)

(b)

(c)

(a)

(b)

(c)

(a)

(b)

(a)

(b)

(a)

(b)

(c)

(d)

(a)

(b)

ORGANIC ELECTROLUMINESCENT DEVICE AND METHOD FOR PRODUCING SAME

TECHNICAL FIELD

The present invention relates to an organic electroluminescent device (e.g., organic EL display device or organic EL illumination device) and a method for producing the same.

BACKGROUND ART

Organic EL (Electro-Luminescent) display devices start being put into practical use. One feature of an organic EL display device is being flexible. An organic EL display device includes, in each of pixels, at least one organic EL element (Organic Light Emitting Diode: OLED) and at least one TFT (Thin Film Transistor) controlling an electric current to be supplied to each of the at least one OLED. Hereinafter, an organic EL display device will be referred to as an "OLED display device". Such an OLED display device including a switching element such as a TFT or the like in each of OLEDs is called an "active matrix OLED display device". A substrate including the TFTs and the OLEDs will be referred to as an "element substrate".

An OLED (especially, an organic light emitting layer and a cathode electrode material) is easily influenced by moisture to be deteriorated and to cause display unevenness. One technology developed in order to provide an encapsulation structure that protects the OLED against moisture while not spoiling the flexibility of the OLED display device is a thin film encapsulation (TFE) technology. According to the thin film encapsulation technology, an inorganic barrier layer and an organic barrier layer are stacked alternately to allow thin films to provide a sufficient level of water vapor barrier property. From the point of view of the moisture-resistance reliability of the OLED display device, such a thin film encapsulation structure is typically required to have a WVTR (Water Vapor Transmission Rate) lower than, or equal to, $1 \times 10^{-4}$ g/m$^2$/day.

A thin film encapsulation structure used in OLED display devices commercially available currently includes an organic barrier layer (polymer barrier layer) having a thickness of about 5 µm to about 20 µm. Such a relatively thick organic barrier layer also has a role of flattening a surface of the element substrate. However, such a thick organic barrier layer involves a problem that the bendability of the OLED display device is limited.

There is also a problem that the mass-productivity is low. The relatively thick organic barrier layer described above is formed by use of a printing technology such as an inkjet method, a microjet method or the like. By contrast, an inorganic barrier layer is formed by a thin film formation technology in a vacuum atmosphere (e.g., lower than, or equal to, 1 Pa). The formation of the organic barrier layer by use of a printing method is performed in the air or a nitrogen atmosphere, whereas the formation of the inorganic barrier layer is performed in vacuum. Therefore, the element substrate is put into, and out of, a vacuum chamber during the formation of the thin film encapsulation structure, which decreases the mass-productivity.

Under such a situation, as disclosed in, for example, Patent Document 1, a film formation device capable of producing an inorganic barrier layer and an organic barrier layer continuously has been developed.

Patent Document 2 discloses a thin film encapsulation structure including a first inorganic material layer, a first resin member and a second inorganic material layer provided on the element substrate in this order. In this thin film encapsulation structure, the first resin member is present locally, more specifically, around a protruding portion of the first inorganic material layer (first inorganic material layer covering a protruding portion). According to Patent Document 2, the first resin member is present locally, more specifically, around the protruding portion, which may not be sufficiently covered with the first inorganic material layer. With such a structure, entrance of moisture or oxygen via the non-covered portion is suppressed. In addition, the first resin member acts as an underlying layer for the second inorganic material layer. Therefore, the second inorganic material layer is properly formed and properly covers a side surface of the first inorganic material layer with an expected thickness. The first resin member is formed as follows. An organic material heated and gasified to be mist-like is supplied onto an element substrate maintained at a temperature lower than, or equal to, room temperature. As a result, the organic material is condensed and put into drops on the substrate. The organic material in drops moves on the substrate by a capillary action or a surface tension to be present locally, more specifically, at a border between a side surface of the protruding portion of the first inorganic barrier layer and a surface of the substrate. Then, the organic material is cured to form the first resin member at the border. Patent Document 3 also discloses an OLED display device including a similar thin film encapsulation structure. Patent Document 4 discloses a film formation device usable to produce an OLED display device.

CITATION LIST

Patent Literature

Patent Document No. 1: Japanese Laid-Open Patent Publication No. 2013-186971
Patent Document No. 2: WO2014/196137
Patent Document No. 3: Japanese Laid-Open Patent Publication No. 2016-39120
Patent Document No. 4: Japanese Laid-Open Patent Publication No. 2013-64187

SUMMARY OF INVENTION

Technical Problem

The thin film encapsulation structure described in each of Patent Documents 2 and 3 does not include a thick organic barrier layer, and therefore, is considered to improve the bendability of the OLED display device. In addition, since the inorganic barrier layer and the organic barrier layer may be formed continuously, the mass-productivity is also improved.

However, according to the studies made by the present inventor, an organic barrier layer formed by the method described in Patent Document 2 or 3 has a problem of not providing a sufficient level of moisture-resistance reliability. This problem has been found out to be caused by water vapor in the air reaching the inside of an active region on the element substrate (may also be referred to as an "element formation region" or a "display region") via the organic barrier layer. It has also been found out that there are mainly two modes in which the water vapor is caused to reach the inside of the active region as described below.

In the above, the problem of the thin film encapsulation structure preferably usable for a flexible organic EL display device is described. The thin film encapsulation structure is usable for another organic EL device such as an organic EL illumination device or the like as well as for the organic EL display device.

The present invention, made to solve the above-described problem, has an object of providing an organic EL device, including a thin film encapsulation structure including a relatively thin organic barrier layer, that is improved in the mass-productivity and the moisture-resistance reliability, and a method for producing the same, by solving at least one of two modes described below that cause the problem.

Solution to Problem

An organic EL device in an embodiment according to the present invention includes an element substrate including a substrate and a plurality of organic EL elements supported by the substrate; and a thin film encapsulation structure formed on the plurality of organic EL elements. The thin film encapsulation structure includes at least one complex stack body includes a first inorganic barrier layer, an organic barrier layer in contact with a top surface of the first inorganic barrier layer, the organic barrier layer including a plurality of solid portions discretely distributed, and a second inorganic barrier layer in contact with the top surface of the first inorganic barrier layer and a top surface of each of the plurality of solid portions of the organic barrier layer. The plurality of solid portions include a plurality of solid portions discretely provided and each having a recessed surface. The term "solid portions" refers to portions, of the organic barrier layer, where the organic barrier film (e.g., photocurable resin) is actually present. A portion where the organic barrier film is not present is referred to as a "non-solid portion". The non-solid portion enclosed by the solid portions may be referred to as an "opening".

In an embodiment, the plurality of solid portions include a plurality of ring-shaped island-like solid portions having a diameter longer than, or equal to, 2 μm converted into a diameter of a circle, as seen in a direction normal to the substrate, and such ring-shaped island-like solid portions adjacent to each other are away from each other by a distance longer than, or equal to, 2 mm.

In an embodiment, the organic EL device further includes a driving circuit supported by the substrate; a plurality of terminals located in a peripheral region; and a plurality of lead wires connecting the driving circuit and the plurality of terminals to each other. The thin film encapsulation structure is provided on a portion of each of the plurality of lead wires that corresponds to the driving circuit, and includes, on the portion of each of the lead wires, an inorganic barrier layer joint portion, where the organic barrier layer is not present and the first inorganic barrier layer and the second inorganic barrier layer are in direct contact with each other.

In an embodiment, at least a portion of each of the plurality of lead wires has, at least at a lowermost portion of each of two side surfaces in contact with the first inorganic barrier layer, a forward tapering side surface portion having a tapering angle smaller than 90 degrees in a cross-section parallel to a line width direction; and the inorganic barrier layer joint portion is provided on the portion of each of the lead wires that has the forward tapering side surface portion.

In an embodiment, the inorganic barrier layer joint portion has a length of at least 0.01 mm.

In an embodiment, the organic barrier layer has an oxidized surface.

In an embodiment, the organic barrier layer is formed of a photocurable resin.

In an embodiment, the organic barrier layer has a thickness less than 500 nm.

In an embodiment, the first inorganic barrier layer and the second inorganic barrier layer are each independently an SiN layer having a thickness of 200 nm or greater and 1000 nm or less.

In an embodiment, the thin film encapsulation structure further includes an inorganic underlying layer and an organic flattening layer formed on the inorganic underlying layer; and the at least one complex stack body is formed in contact with a top surface of the organic flattening layer.

In an embodiment, the thin film encapsulation structure further includes an organic flattening layer; the at least one complex stack body includes two complex stack bodies; and the organic flattening layer is formed between the two complex stack bodies.

In an embodiment, the organic flattening layer has a thickness greater than, or equal to, 3 μm.

A method for producing an organic EL device in an embodiment according to the present invention is a method for producing any organic EL device described above. A step of forming the complex stack body includes the steps of preparing, in a chamber, the element substrate having the first inorganic barrier layer formed thereon; supplying a vapor-like or mist-like photocurable resin into the chamber; condensing the photocurable resin on the first inorganic barrier layer to form a liquid film; irradiating the liquid film of the photocurable resin with light to form a photocurable resin layer; and partially ashing the photocurable resin layer to form the organic barrier layer.

In an embodiment, the ashing is performed by plasma ashing by use of at least one type of gas among $N_2O$, $O_2$ and $O_3$.

The above-described embodiments of the present invention may be combined with any of the following embodiments.

An organic EL device in an embodiment according to the present invention includes a substrate; a plurality of TFTs formed on the substrate; a plurality of gate bus lines and a plurality of source bus lines each connected with any of the plurality of TFTs; a plurality of organic EL elements each connected with any of the plurality of TFTs; a plurality of terminals located in a peripheral region outer to an active region where the plurality of organic EL elements are located; a plurality of lead wires connecting the plurality of terminals and either the plurality of gate bus lines or the plurality of source bus lines; and a thin film encapsulation structure formed on the plurality of organic EL elements and on a portion of each of the plurality of lead wires that corresponds to the active region. The thin film encapsulation structure includes a first inorganic barrier layer, an organic barrier layer in contact with the first inorganic barrier layer, and a second inorganic barrier layer in contact with the organic barrier layer. At least a portion of each of the plurality of lead wires has, at least at a lowermost portion of each of two side surfaces in contact with the first inorganic barrier layer, a forward tapering side surface portion having a tapering angle smaller than 90 degrees in a cross-section parallel to a line width direction; and on the portion of each of the lead wires that has the forward tapering side surface portion, the organic barrier layer is not present and the first inorganic barrier layer and the second inorganic barrier layer are in direct contact with each other.

In an embodiment, the plurality of terminals each include a forward tapering side surface portion having a tapering angle smaller than 90 degrees at least at a lowermost portion of all exposed side surfaces thereof.

In an embodiment, the forward tapering side surface has a tapering angle smaller than, or equal to, 85 degrees.

In an embodiment, the forward tapering side surface has a length longer than, or equal to, 50 nm in a direction normal to the substrate.

In an embodiment, the portion of each of the plurality of lead wires where the organic barrier layer is not present and the first inorganic barrier layer and the second inorganic barrier layer are in direct contact with each other has a length of at least 0.01 mm.

In an embodiment, the plurality of gate bus lines and the plurality of source bus lines each have side surfaces each having a tapering angle exceeding 85 degrees in a cross-section parallel to a line width direction thereof.

In an embodiment, the organic barrier layer is not substantially present in a flat portion.

In an embodiment, an underlying surface for the organic barrier layer includes a bank substantially enclosing the active region, and the bank has, at least at a lowermost portion of each of two side surfaces thereof in contact with the first inorganic barrier layer, a forward tapering side surface portion having a tapering angle smaller than 90 degrees in a cross-section parallel to a width direction thereof. A portion of each of the lead wires that is on the bank has a forward tapering side surface portion, and on the bank, the organic barrier layer is not present and the first inorganic barrier layer and the second inorganic barrier layer are in direct contact with each other.

A method for producing an organic EL device in an embodiment according to the present invention is a method for producing any organic EL device described above. The method includes step A of forming the first inorganic barrier layer selectively on the active region of the substrate on which the plurality of organic EL elements are formed; a step, after the step A, of locating the substrate in a chamber and supplying a vapor-like or mist-like photocurable resin into the chamber; step B of condensing the photocurable resin on the first inorganic barrier layer such that the photocurable resin is not present on the portion of each of the lead wires that has the forward tapering side surface portion; and a step, after the step B, of irradiating the condensed photocurable resin with light to form the organic barrier layer of the photocurable resin.

A method for producing an organic EL device in an embodiment according to the present invention is a method for producing any organic EL device described above. The method includes step A of forming the first inorganic barrier layer selectively on the active region of the substrate on which the plurality of organic EL elements are formed; a step, after the step A, of locating the substrate in a chamber and supplying a vapor-like or mist-like photocurable resin into the chamber; a step of condensing the photocurable resin on the first inorganic barrier layer to form a liquid film of the photocurable resin; a step of irradiating the liquid film of the photocurable resin with light to form a photocurable resin layer; and partially ashing the photocurable resin layer to form the organic barrier layer.

In an embodiment, the method for producing the organic EL device includes a step of forming the plurality of gate bus lines, the plurality of source bus lines, the plurality of lead wires, and the plurality of terminals by a dry etching process.

In an embodiment, the step of forming the plurality of lead wires includes a step of forming the portion having the forward tapering side surface portion by a photography step using a multi-gray scale mask.

In an embodiment, the photocurable resin contains a vinyl group-containing monomer. It is preferred that the vinyl group-containing monomer contains an acrylic monomer. The photocurable resin may be silicone resin.

An organic EL device in an embodiment according to the present invention includes an organic EL element formed on a substrate; and a thin film encapsulation structure formed on the organic EL element. The thin film encapsulation structure includes a first inorganic barrier layer, an organic barrier layer in contact with the first inorganic barrier, and a second inorganic barrier layer in contact with the organic barrier layer. The organic barrier layer is present on at least a portion of a flat portion, and has an oxidized surface. Herein, the "flat portion" refers to a lowest portion of a flat portion of a surface of the organic EL element on which the thin film encapsulation structure is formed. The "flat portion" does not include a portion of the surface of the organic barrier layer to which a particle (microscopic dust particle) is attached.

In an embodiment, the first inorganic barrier layer and the second inorganic barrier layer are each independently an SiN layer having a thickness of 200 nm or greater and 1000 nm or less. The SiN layer has a film stress having an absolute value preferably smaller than, or equal to, 100 MPa, more preferably smaller than, or equal to, 50 Mpa. It is preferred that the SiN layer is formed at a temperature lower than, or equal to, 90° C.

A method for producing an organic EL device in an embodiment according to the present invention is a method for producing any organic EL device described above. The method includes steps of preparing of preparing, in a chamber, the element substrate having the first inorganic barrier layer formed thereon; supplying a vapor-like or mist-like photocurable resin into the chamber; condensing the photocurable resin on the first inorganic barrier layer to form a liquid film of the photocurable resin; irradiating the liquid film of the photocurable resin with light to form a photocurable resin layer; and partially ashing the photocurable resin layer to form the organic barrier layer.

In an embodiment, the ashing is performed by plasma ashing by use of at least one type of gas among $N_2O$, $O_2$ and $O_3$.

Advantageous Effects of Invention

An embodiment of the present invention provides an organic EL device, including a thin film encapsulation structure including a relatively thin organic barrier layer, that is improved in the mass-productivity and the moisture-resistance reliability, and a method for producing the same.

BRIEF DESCRIPTION OF DRAWINGS

FIG. 3(a) is a cross-sectional view taken along line 3A-3A' in FIG. 2, FIG. 3(b) is a cross-sectional view taken along line 3B-3B' in FIG. 2, FIG. 3(a) is a cross-sectional view taken along line 3C-3C' in FIG. 2, FIG. 3(d) is a cross-sectional view taken along line 3D-3D' in FIG. 2, and FIG. 3(e) is a cross-sectional view taken along line 3E-3E' in FIG. 2.

FIG. 4(a) is a schematic cross-sectional view of the first inorganic barrier layer covering the particle P.

FIG. 6(a) is a cross-sectional view of a portion including the particle P, and FIG. 6(b) is a cross-sectional view of a portion including a bank 3DB formed on an underlying surface for an organic barrier layer 14D (e.g., surface of the OLED 3) to substantially enclose an active region.

DESCRIPTION OF EMBODIMENTS

Hereinafter, an OLED display device and a method for producing the same in embodiments according to the present invention will be described with reference to the drawings. The embodiments of the present invention are not limited to the embodiments that are described below as examples.

[First Mode]

First, a first mode among the two modes in which the water vapor in the air is caused to reach the inside of the active region via the organic barrier layer will be described.

In the case where an organic barrier layer is to be formed by use of a printing method such as an inkjet method or the like, it is possible to form the organic barrier layer only in an active region on the element substrate but not in a region other than the active region. In this case, in the vicinity of the active region (outer to the active region), there is a region where the first inorganic material layer and the second inorganic material layer are in direct contact with each other. The organic barrier layer is fully enclosed by the first inorganic material layer and the second inorganic material layer, and is insulated from the outside of the first inorganic material layer and the second inorganic material layer.

By contrast, according to the method for forming the organic barrier layer described in Patent Document 2 or 3, a resin (organic material) is supplied to the entire surface of the element substrate, and the surface tension of the resin in a liquid state is used to locate the resin locally, more specifically, at the border between the surface of the substrate and the side surface of the protruding portion on the surface of the element substrate. Therefore, the organic barrier layer may also be formed in a region other than the active region (the region other than the active region may also be referred to as a "peripheral region"), namely, in a terminal region where a plurality of terminals are located and in a lead wire region where lead wires extending from the active region to the terminal region are formed. Specifically, the resin is present locally, more specifically, for example, at the border between the surface of the substrate and side surfaces of the lead wires or side surfaces of the terminals. In this case, an end of a portion of the organic barrier layer that is formed along the lead wires is not enclosed by the first inorganic barrier layer and the second inorganic barrier layer, but is exposed to the air (ambient atmosphere).

An organic barrier layer is lower in the water vapor barrier property than an inorganic barrier layer. Therefore, the organic barrier layer formed along the lead wires acts as a route that leads the water vapor in the air into the active region. This is the first mode. Hereinafter, first, an embodiment of suppressing the decline in the moisture-resistance reliability caused by the first mode will be described.

Figure 1:
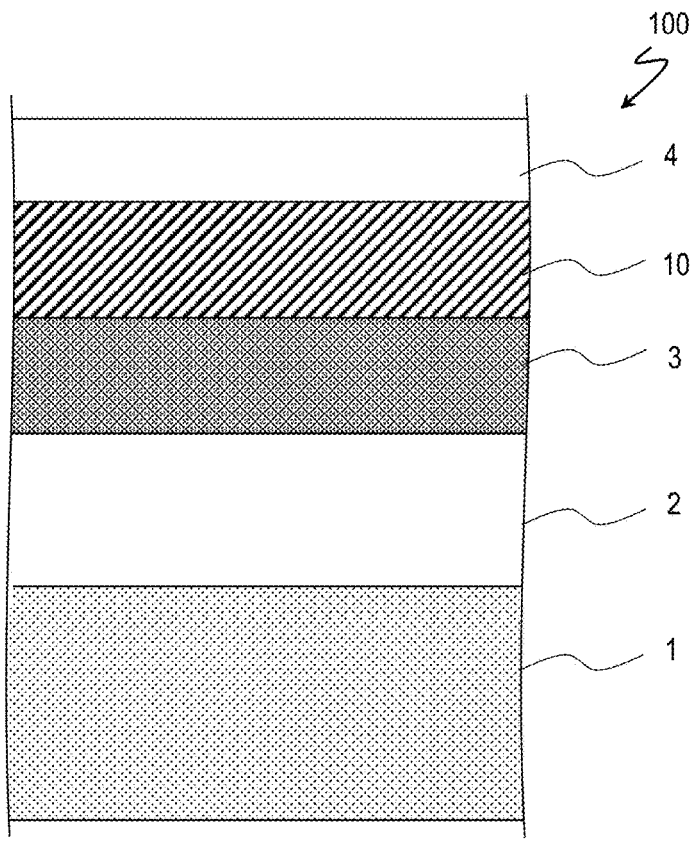
FIG. 1(a) is a schematic partial cross-sectional view of an active region of an OLED display device 100 in an embodiment according to the present invention.
FIG. 1(b) is a partial cross-sectional view of a TFE structure 10 formed on an OLED 3.
Figure 1:
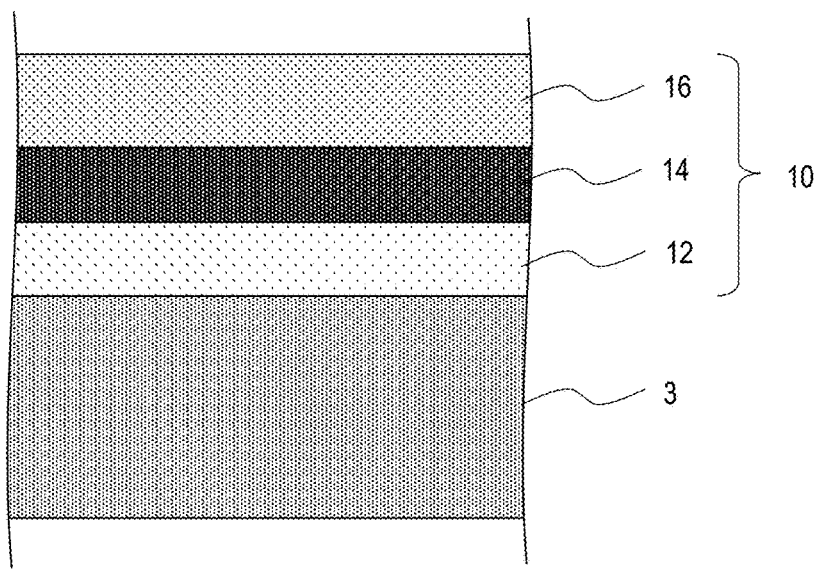

With reference to FIG. 1(a) and FIG. 1(b), a basic structure of an OLED display device 100 in an embodiment according to the present invention will be described. FIG. 1(a) is a schematic partial cross-sectional view of an active region of the OLED display device 100 in an embodiment according to the present invention. FIG. 1(b) is a partial cross-sectional view of a TFE structure 10 formed on an OLED 3. An OLED display device in each of embodiment 1 and embodiment 2 described below basically has the same structure, and specifically may have the same structure as that of the OLED display device 100 except for the TFE structure.

The OLED display device 100 includes a plurality of pixels, and each of the pixels includes at least one organic EL element (OLED). Herein, a structure corresponding to one OLED will be described for simplicity.

As shown in FIG. 1(a), the OLED display device 100 includes a flexible substrate (hereinafter, may be referred to simply as a "substrate") 1, a circuit (back plane) 2 formed on the substrate 1 and including a TFT, the OLED 3 formed on the circuit 2, and the TFE structure 10 formed on the OLED 3. The OLED 3 is, for example, of a top emission type. An uppermost portion of the OLED 3 is, for example, a top electrode or a cap layer (refractive index adjusting layer). An optional polarization plate 4 is located on the TFE structure 10.

The substrate 1 is, for example, a polyimide film having a thickness of 15 μm. The circuit 2 including the TFT has a thickness of, for example, 4 μm. The OLED 3 has a thickness of, for example, 1 μm. The TFE structure 10 has a thickness of, for example, less than, or equal to, 1.5 μm.

FIG. 1(b) is a partial cross-sectional view of the TFE 10 formed on the OLED 3. A first inorganic barrier layer (e.g., SiN layer) 12 is formed immediately on the OLED 3, an organic barrier layer (e.g., acrylic resin layer) 14 is formed on the first inorganic barrier layer 12, and a second inorganic barrier layer (e.g., SiN layer) 16 is formed on the organic barrier layer 14.

For example, the first inorganic barrier layer 12 and the second inorganic barrier layer 16 are each an SiN layer having a thickness of, for example, 400 nm, and the organic barrier layer 14 is an acrylic resin layer having a thickness less than 100 rm. The thicknesses of the first inorganic barrier layer 12 and the second inorganic barrier layer 16 are each independently 200 nm or greater and 1000 nm or less, and the thickness of the organic barrier layer 14 is 50 nm or greater and less than 200 nm. The TFE structure 10 has a thickness of, preferably, 400 nm or greater and less than 2 μm, and more preferably, 400 nm or greater and less than 1.5 μm.

The TFE structure 10 is formed to protect an active region (see active region R1 in FIG. 2) of the OLED display device 100. As described above, the TFE structure 10 includes the first inorganic barrier layer 12, the organic barrier layer 14 and the second inorganic barrier layer 16 in this order, with the first inorganic barrier layer 12 being closest to the OLED 3, on at least the active region. The organic barrier layer 14 is not present as a film covering the entirety of the active region, but includes a plurality of solid portions (portions where the organic film is actually present) discretely distributed. A portion where no organic film is present is referred to as a "non-solid portion". The non-solid portion enclosed by the solid portions may be referred to as an "opening". In the non-solid portion, the first inorganic barrier layer 12 and the second inorganic barrier layer 16 are in direct contact with each other. The non-solid portion of the organic barrier layer 14 includes at least a continuous portion enclosing the active region, and the active region is completely enclosed by the portion in which the first inorganic barrier layer 12 and the second inorganic barrier layer 16 are in direct contact with each other (hereinafter, such a portion will be referred to as an "inorganic barrier layer joint portion".

Embodiment 1

With reference to FIG. 2 through FIG. 5, an OLED display device and a method for producing the same in embodiment 1 according to the present invention will be described.

Figure 2:
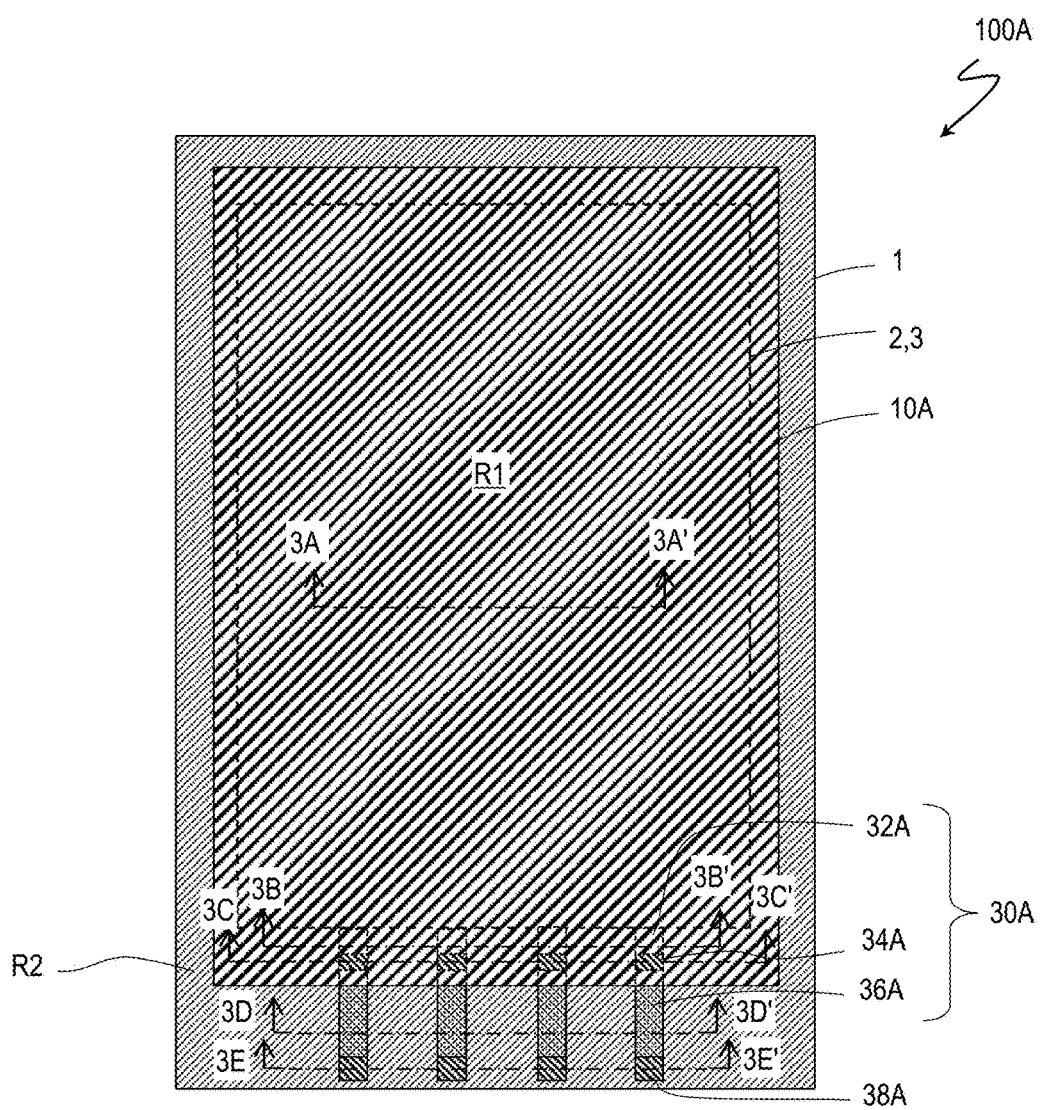
FIG. 2 is a plan view schematically showing a structure of an OLED display device 100A in embodiment 1 according to the present invention.
Figure 3:
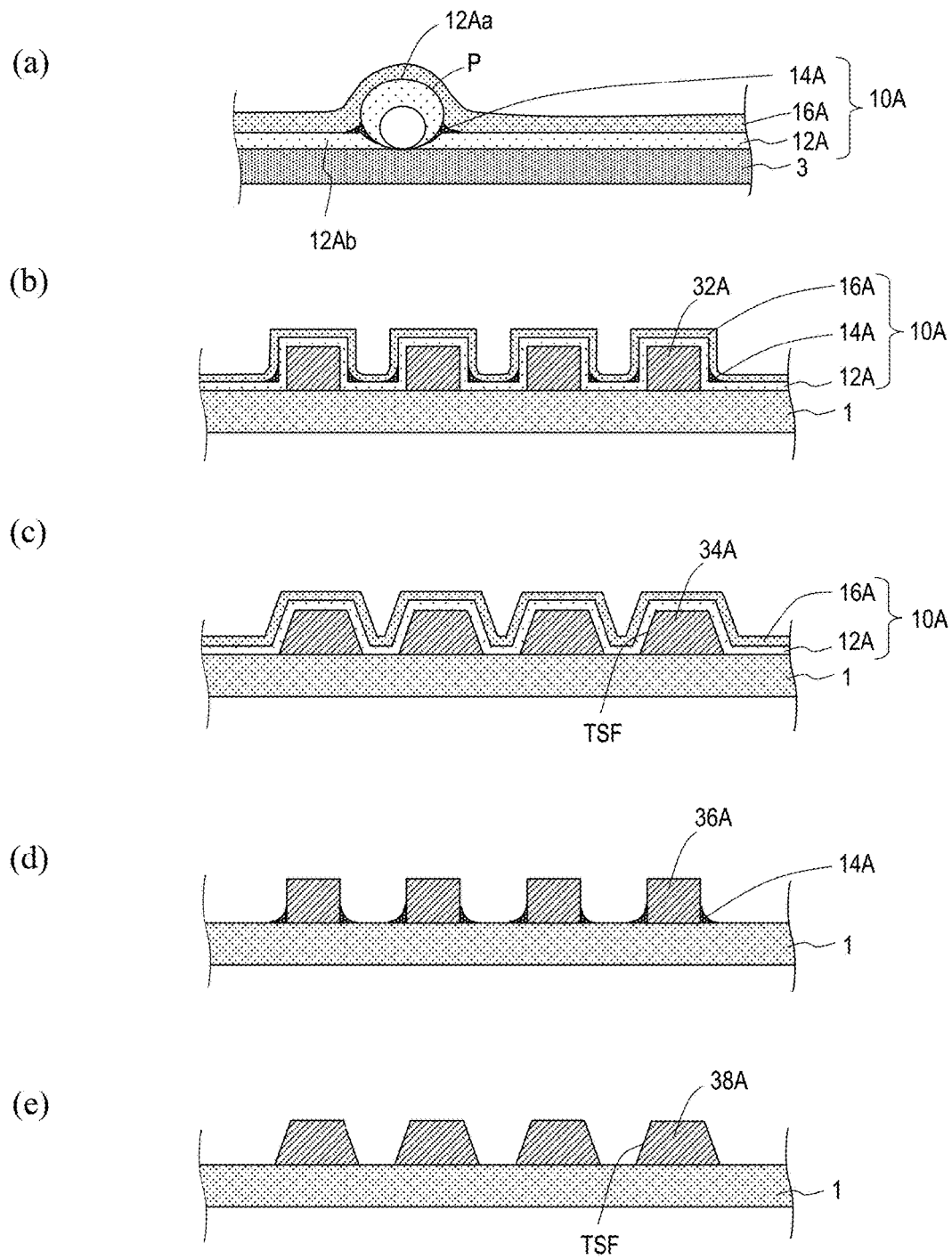
FIG. 3(a) through FIG. 3(e) are each a schematic cross-sectional view of the OLED display device 100A.

FIG. 2 is a schematic plan view of an OLED display device 10A in embodiment 1 according to the present invention.

The OLED display device 100A includes the flexible substrate 1, the circuit (may be referred to as a "driving circuit" or a "back plane circuit") 2 formed on the substrate 1, a plurality of the OLEDs 3 formed on the circuit 2, and a TFE structure 10A formed on the OLEDs 3. A layer including the plurality of OLEDs 3 may be referred to as an "OLED layer 3". The circuit 2 and the OLED layer 3 may share a part of components. The optional polarization plate (see reference numeral 4 in FIG. 1) may further be located on the TFE structure 10A. In addition, for example, a layer having a touch panel function may be located between the TFE structure 10A and the polarization plate. Namely, the OLED display device 100A may be altered to a display device including an on-cell type touch panel.

The circuit 2 includes a plurality of TFTs (not shown), and a plurality of gate bus lines (not shown) and a plurality of source bus lines (not shown) each connected to either one of the plurality of TFT's (not shown). The circuit 2 may be a known circuit that drives the plurality of OLEDs 3. The plurality of OLEDs 3 are each connected with either one of the plurality of TFTs included in the circuit 2. The OLEDs 3 may be known OLEDs.

The OLED display device 100A further includes a plurality of terminals 38A located in a peripheral region R2 outer to the active region (region enclosed by the dashed line in FIG. 2) R1, where the plurality of OLEDs 3 are located, and includes a plurality of lead wires 30A respectively connecting the plurality of terminals 38A and either the plurality of gate bus lines or the plurality of source bus lines to each other. The TFE structure 10A is formed on the plurality of OLEDs 3 and on a portion of each of the plurality of lead wires 30A that corresponds to the active region R1. Namely, the TFE structure 10A covers the entirety of the active region R1 and is also selectively formed on the portion of each of the plurality of lead wires 30A that corresponds to the active region R1. Neither a portion of each of the plurality of lead wires 30A that corresponds to the terminals 38A, nor the terminals 38A, are covered with the TFE structure 10A.

Hereinafter, an example in which the lead wires 30A and the terminals 38A are integrally formed of the same conductive layer will be described. Alternatively, the lead wires 30A and the terminals 38A may be formed of different conductive layers (encompassing stack structures).

Now, with reference to FIG. 3(a) through FIG. 3(e), the TFE structure 10A of the OLED display device 100A will be described. FIG. 3(a) is a cross-sectional view taken along line 3A-3A' in FIG. 2. FIG. 3(b) is a cross-sectional view taken along line 3B-3B' in FIG. 2. FIG. 3(a) is a cross-sectional view taken along line 3C-3C' in FIG. 2. FIG. 3(d) is a cross-sectional view taken along line 3D-3D' in FIG. 2. FIG. 3(e) is a cross-sectional view taken along line 3E-3E' in FIG. 2. FIG. 3(d) and FIG. 3(e) are cross-sectional views of a region where the TFE structure 10A is not formed, but are provided because an organic barrier layer 14A may extend to a region where the terminals 38A are formed (terminal region).

As shown in FIG. 3(a) through FIG. 3(a), the TFE structure 10A includes a first inorganic barrier layer 12A formed on the OLED 3, the organic barrier layer 14A in contact with the first inorganic barrier layer 12A, and a second inorganic barrier layer 16A in contact with the organic barrier layer 14A. The first inorganic barrier layer 12A and the second inorganic barrier layer 16A are each, for example, an SiN layer, and are selectively formed in a predetermined region so as to cover the active region R1 by plasma CVD by use of a mask. In this example, the first inorganic barrier layer 12A and the second inorganic barrier layer 16A are each independently selectively formed on the active region R1 and on the portion of each of the plurality of lead wires 30A that corresponds to the active region R1. From the point of view of the reliability, it is preferred that the second inorganic barrier layer 16A is formed in the same region as that of the first inorganic barrier layer 12A (such that outer edges thereof match each other) or is formed so as to cover the entirety of the first inorganic barrier layer 12A.

Figure 20:
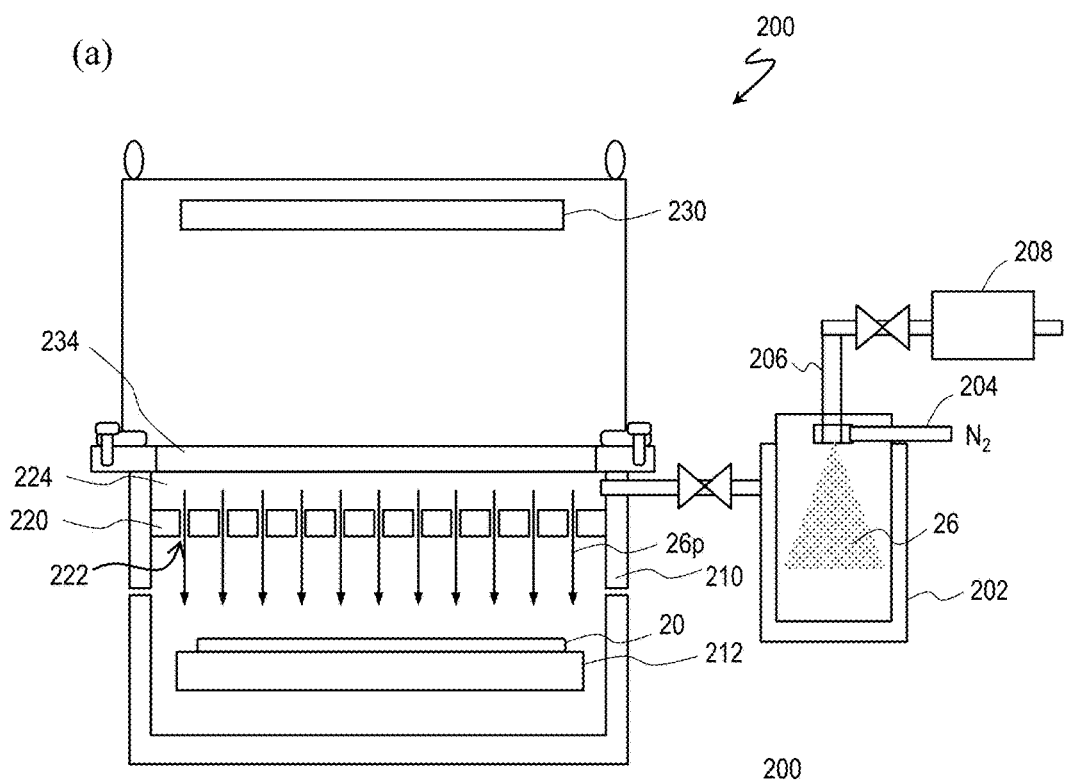
FIG. 20(a) and FIG. 20(b) are each a schematic view showing a structure of a film formation device 200 usable to form an organic barrier layer 14.
Figure 20:
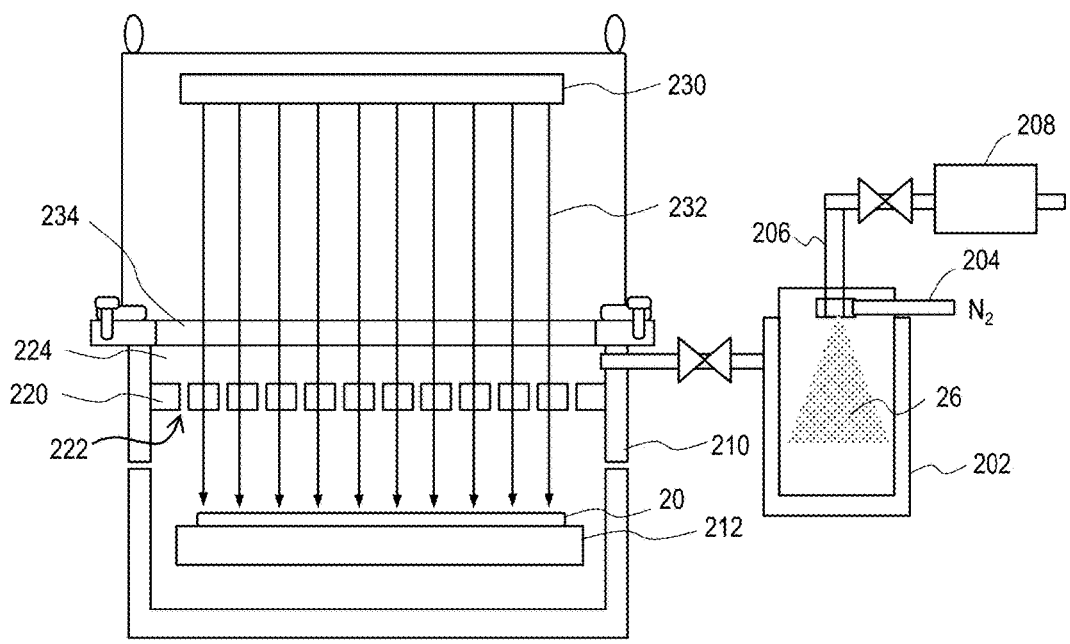

The organic barrier layer 14A may be formed by, for example, the method described in Patent Document 2 or 3. For example, as described below in detail with reference to FIG. 20, a film formation device 200 is used to supply, in a chamber, a vapor-like or mist-like photocurable resin (e.g., acrylic monomer) onto the element substrate maintained at a temperature lower than, or equal to, room temperature, condense the photocurable resin on the element substrate, and locate the photocurable resin, put into a liquid state, locally, more specifically, at a border between a side surface of a protruding portion and a flat portion of the first inorganic barrier layer 12A by a capillary action or a surface tension of the photocurable resin in the liquid state. Then, the photocurable resin is irradiated with, for example, ultraviolet light to form solid portions of the organic barrier layer (e.g., acrylic resin layer) 14A in a border region in the vicinity of the protruding portion. The organic barrier layer 14A formed by this method does not substantially include a solid portion on the flat portion. Regarding the method for forming the organic barrier layer, the disclosures of Patent Documents 2 and 3 are incorporated herein by reference.

Alternatively, the organic barrier layer 14A in the TFE structure 10A may be formed by a method for forming a TFE structure 10D included in an OLED display device in embodiment 2 described below. In the TFE structure 10D, the solid portions are present also on the flat portion. This method is changed as follows in order to form the TFE structure 10A. An initial thickness of a resin layer (approximately equal to the thickness of the liquid film of the photocurable resin) formed by use of the film formation device 200 is adjusted (to, for example, less than 100 nm), and/or the ashing conditions (including time) are adjusted.

FIG. 3(a) is a cross-sectional view taken along line 3A-3A' in FIG. 2, and shows a portion including a particle P. The particle P is a microscopic dust particle generated during the production of the OLED display device, and is, for example, a microscopic piece of broken glass, a metal particle or an organic particle. Such a particle is especially easily generated in the case where mask vapor deposition is used.

As shown in FIG. 3(a), the organic barrier layer (solid portion) 14A may be formed only in the vicinity of the particle P. A reason for this is that the acrylic monomer supplied after the first inorganic barrier layer 12A is formed is condensed and present locally, namely, in the vicinity of a surface of a first inorganic barrier layer 12Aa on the particle P (the surface has a tapering angle larger than 90 degrees). The organic barrier layer 14A includes the non-solid portion on the flat portion of the first inorganic barrier layer 12A.

Now, with reference to FIG. 4(a), FIG. 4(b) and FIG. 4(a), a structure of the portion including the particle P will be described. FIG. 4(a) is an enlarged view of the portion including the particle P shown in FIG. 3(a). FIG. 4(b) is a schematic plan view showing the size relationship among the particle P, the first inorganic barrier layer (SiN layer) covering the particle P and the organic barrier layer. FIG. 4(c) is a schematic cross-sectional view of the first inorganic barrier layer (e.g., SiN layer) covering the particle P.

In the case where the particle P (having a diameter, for example, longer than, or equal to, 1 μm) is present, a crack (void) 12Ac may be formed in the first inorganic barrier layer as shown in FIG. 4(a). As described below, this is considered to be caused by impingement of the SiN layer 12Aa growing from a surface of the particle P and an SiN layer 12Ab growing from a flat portion of a surface of the OLED 3. In the case where such a crack 12Ac is present, the level of barrier property of the TFE structure 10A is decreased.

In the TFE structure 10A in the OLED display device 100A, as shown in FIG. 4(a), the organic barrier layer 14A is formed to fill the crack 12Ac of the first inorganic barrier layer 12A, and a surface (recessed) of the organic barrier layer 14A couples a surface of the first inorganic barrier layer 12Aa on the particle P and a surface of the first inorganic barrier layer 12Ab on the flat portion of the OLED 3 to each other continuously and smoothly. The organic barrier layer 14A, which is formed by curing a photocurable resin in a liquid state as described below, forms the recessed surface by a surface tension. In this state, the photocurable resin exhibits a high level of wettability to the first inorganic barrier layer 12A. If the level of wettability of the photocurable resin to the first inorganic barrier layer 12A is low, the surface of the organic barrier layer 14A may protrude.

The organic barrier layer (solid portion) 14A having the recessed surface couples the surface of the first inorganic barrier layer 12Aa on the particle P and the surface of the first inorganic barrier layer 12Ab on the flat portion to each other continuously and smoothly. Therefore, the second inorganic barrier layer 16A formed thereon is a fine film with no void. As can be seen, even if there is the particle P, the organic barrier layer 14A keeps high the level of barrier property of the TFE structure 10A.

As shown in FIG. 4(b), the organic barrier layer 14A (solid portion) is formed in a ring shape around the particle P. Where the particle P has a diameter (measured value converted into a diameter of a circle) of about 1 μm, the ring-shaped solid portion has a diameter $D_0$ (measured value converted into a diameter of a circle) that is, for example, longer than, or equal to, 2 μm. As described below, it is preferred that among a plurality of island-like solid portions discretely distributed, two adjacent island-like solid portions are away from each other by a distance longer than, or equal to, 2 mm. Namely, it is preferred that the island-like solid portions are enclosed by an inorganic barrier layer joint portion having a width longer than, or equal to, 2 mm. Such a structure suppresses the decline in the moisture-resistance reliability caused by the water vapor in the air reaching the inside of the active region via the organic barrier layer 14A (second mode described below).

Now, with reference to FIG. 3(b) and FIG. 3(a), a structure of the TFE structure 10A on the lead wires 30A will be described. FIG. 3(b) is a cross-sectional view taken along line 3B-3B' in FIG. 2, more specifically, a cross-sectional view of portions 32A, of the lead wires 30A, corresponding to the active region a1. FIG. 3(c) is a cross-sectional view taken along line 3C-3C' in FIG. 2, more specifically, a cross-sectional view of portions 34A each having a forward tapering side surface portion (inclining side surface) TSF having a tapering angle smaller than 90 degrees.

The lead wires 30A are patterned by the same step as that of, for example, the gate bus lines or the source bus lines. Thus, in this example, the gate bus lines and the source bus lines formed in the active region R1 also have the same cross-sectional structure as that of the portion 32A, of each of the lead wires 30A, corresponding to the active region R1 shown in FIG. 3(b).

The OLED display device 100A in an embodiment according to the present invention is preferably usable for, for example, medium- or small-sized high-definition smartphones and tablet terminals. In a medium- or small-sized (e.g., 5.7-type) high-definition (e.g., 500 ppi) OLED display device, it is preferred that the lines (encompassing the gate bus lines and the source bus lines) in the active region R1 have a cross-sectional shape, in a direction parallel to a line width direction, close to a rectangle (side surfaces of the lines have a tapering angle of about 90 degrees) in order to allow the lines to have a sufficiently low resistance with a limited line width. By contrast, the active region R1 of the OLED display device 100k is substantially enclosed by the inorganic barrier layer joint portion, in which the first inorganic barrier layer 12A and the second inorganic barrier layer 16A are in direct contact with each other. Therefore, it does not occur that the organic barrier layer 14A acts as a moisture entrance route allowing the moisture to reach the active region R1 of the OLED display device. The inorganic barrier layer joint portion is formed on a portion of the lead wire 30A that has a forward tapering side surface portion. In the case where the forward tapering side surface portion is formed, where a bottom surface of the lead wire 30A has a constant width, the cross-sectional area size of the lead wire 30A is decreased and thus the resistance is increased. Therefore, it is preferred that the lead wire 30A has the forward tapering side surface portion selectively only in a portion thereof whereas the rest of the lead wire 30A has a rectangular cross-section in order to have a low resistance. It is preferred that the lines formed in the active region R1 also have a rectangular cross-section. The length of the lead wire 30A having the forward tapering side surface portion may be appropriately set based on the relationship with the moisture-resistance reliability. Nonetheless, if a sufficiently low resistance is provided, the lead wire 30A may have the forward tapering side surface portion in the entire length thereof.

The OLED display device 100A is, for example, a medium- or small-sized high-definition display device, and the side surfaces of the gate bus lines and the source bus lines have a tapering angle of about 90 degrees in a cross-section parallel to the width direction. The side surfaces of the portion 32A, of the lead wire 30A, corresponding to the active region R1 have a tapering angle of about 90 degrees in a cross-section parallel to the width direction, like the gate bus lines or the source bus lines. The organic barrier layer (solid portion) 14A is formed on a lowermost portion of the first inorganic barrier layer 12A covering the portion 32A of the lead wire 30A (at the border between the portion covering each side surface of the lead wire 30A and the portion formed on the flat portion of the substrate 1). A reason for this is that the organic material tends to be located locally, more specifically, in a portion, of the first inorganic barrier layer 12A, that has a surface having an angle smaller than, or equal to, 90 degrees.

By contrast, referring to FIG. 3(a), the portion 34A of the lead wire 30A has the forward tapering side surface portion (inclining side surface portion) TSF having a tapering angle smaller than 90 degrees. The tapering angle of the forward tapering side surface portion TSF is preferably 85 degrees or smaller, and more preferably 70 degrees or smaller. A reason for this is that in the portion having the forward tapering side surface portion TSF, the surface of the first inorganic barrier layer 12A does not have an angle smaller than, or equal to, 90 degrees, and therefore, the organic material is not easily located in this portion. Even if the organic material is located in the portion in which the surface of the first inorganic barrier layer 12A has an angle larger than 90 degrees, the amount of the organic material is smaller than the amount of the organic material in the portion in which the surface of the first inorganic barrier layer 12A has an angle smaller than, or equal to, 90 degrees. Therefore, for example, ashing described below may be performed on the organic barrier layer 14A once formed, so that the organic material is removed from the portion in which the surface of the first inorganic barrier layer 12A has an angle larger than 90 degrees.

On the portion 34A, of the lead wire 30A, having the forward tapering side surface portion TSF shown in FIG. 3(a), the organic barrier layer (solid portion) 14A is not present and the first inorganic barrier layer 12A and the second inorganic barrier layer 16A are in direct contact with each other (namely, the inorganic barrier layer joint portion is formed). The organic barrier layer (solid portion) 14A is not formed on the flat portion. Therefore, the lead wire 30A is covered with the inorganic barrier layer joint portion, in which the first inorganic barrier layer 12A and the second inorganic barrier layer 16A are in direct contact with each other, in the cross-section taken along line 3C-3C' in FIG. 2. Therefore, as described above, it does not occur that the organic barrier layer formed along the lead wire acts as a route that guides the water vapor in the air into the active region. From the point of view of the moisture-resistance reliability, it is preferred that the length of the portion 34A of the lead wire 30A, namely, the length of the inorganic barrier layer joint portion is at least 0.01 mm. There is no upper limit on the length of the inorganic barrier layer joint portion. However, even if the length of the inorganic barrier layer joint portion exceeds 0.1 mm, the effect of improving the moisture-resistance reliability is substantially saturated, and rather, merely increases the width of the frame portion. Therefore, the length of the inorganic barrier layer joint portion is preferably shorter than, or equal to, 0.1 mm, and may be, for example, shorter than, or equal to, 0.05 mm. The conventional TFE structure in which the organic barrier layer is formed by the inkjet method includes an inorganic barrier layer joint portion having a length of about 0.5 mm to 1.0 mm in consideration of the variance in the position at which an end of the organic barrier layer is located. By contrast, in an embodiment according to the present invention, the length of the inorganic barrier layer joint portion may be shorter than, or equal to, 0.1 mm. This decreases the width of the frame portion of the organic EL display device.

Now, FIG. 3(d) and FIG. 3(e) will be referred to. FIG. 3(d) and FIG. 3(e) are cross-sectional views of the region where the TFE structure 10A is not formed. Portions 36A, of the lead wires 30A, shown in FIG. 3(d) each have substantially the same cross-sectional shape as that of the portion 32A, of the lead wire 30A shown in FIG. 3(b). On a lowermost portion of each of side surfaces of the portion 36A, the organic barrier layer 14A is formed. By contrast, the terminals 38A shown in FIG. 3(e) each have substantially the same cross-sectional shape as that of the portion 34A of the lead wire 30A shown in FIG. 3(a), and each have a forward tapering side surface portion TSF having a tapering angle smaller than 90 degrees. Therefore, the organic barrier layer (solid portion) 14A is not present on side surfaces of the terminals 38A. The organic barrier layer (solid portion) 14A is not present either on the flat portion.

As described above, the organic barrier layer 14A, which is formed by a process including a step of supplying a vapor-like or mist-like organic material (e.g., acrylic monomer), cannot be selectively formed only in a predetermined region, unlike the first inorganic barrier layer 12A or the second inorganic barrier layer 16A. Therefore, the organic barrier layer (solid portion) 14A may be formed also on the terminals 38A. This requires the organic barrier layer 14A on the terminals 38A to be removed, which decreases the mass-productivity. Formation of the forward tapering side surface portion TSF on each of the side surfaces of each terminal 38A suppresses the formation of the organic barrier layer (solid portion) 14A on the side surfaces of the terminals 38A. It is preferred that the forward tapering side surface portion TSF is formed on the entirety of the side surfaces of the terminal 38A. The organic barrier layer (solid portion) 14A, even if being formed on the side surfaces or a top surface of the terminal 38A, may be removed by ashing.

The portion 36A of the lead wire 30A shown in FIG. 3(d) may have the substantially the same cross-sectional shape as that of the portion 34A shown in FIG. 3(c) and the terminal 38A shown in FIG. 3(e). In the step of forming the lead wires 30A, the lead wire 30A may be formed to have the forward tapering side surface portion TSF by one exposure step by a photolithography step by use of a multi-gray scale mask (half-tone mask or gray-tone mask). In this specification, the "photolithography step" includes resist supply, exposure, development, etching using the resist as a mask, and peel-off of the resist.

Now, FIG. 5(a) and FIG. 5(b) will be referred to. FIG. 5(a) and FIG. 5(b) are respectively schematic partial cross-sectional views of TFE structures 10B and 10C included in other OLED display devices in embodiment 1.

FIG. 5(a) is a schematic cross-sectional view of the TFE structure 10B taken along line 3B-3B' in FIG. 2, more specifically, a cross-sectional view of portions 32B, of the lead wires, corresponding to the active region R1.

In the case where, for example, the lead wires 30A having a cross-sectional shape shown in FIG. 3(b) are to be formed, the portions 32B each having inversely tapering side surfaces as shown in FIG. 5(a) may be formed by variance in the process conditions. When the inversely tapering side surfaces are formed, a first inorganic barrier layer 12B becomes discontinuous. Even in this case, an organic barrier layer 14B is formed on a lowermost portion of each of side surfaces of the portion 32B of the lead wire, so that a second inorganic barrier layer 16B with no void is formed thereon. In this manner, in the case where the particle P is present or in the case where a pattern having an inversely tapering cross-sectional shape is formed, the organic barrier layer 14B suppresses the moisture-resistance reliability from being declined.

FIG. 5(b) is a schematic cross-sectional view of the TFE structure 10C taken along line 3C-3C' in FIG. 2. In the TFE structure 10A, the entirety of each side surface of the portion 34A is a forward tapering side surface portion TSF. As shown in FIG. 5(b), portions 34C may each have side surfaces each having a forward tapering side surface portion TSF at least at a lowermost portion thereof. The organic material (e.g., acrylic monomer) tends to be located locally, more specifically, in the lowermost portion of the side surface (border with the flat portion). Therefore, it is sufficient to suppress the organic material from being located at this portion. It is preferred that the forward tapering side surface portion TSF has a height (length in a direction normal to the substrate) that is greater than the thickness of the organic material, for example, greater than, or equal to, 50 nm, more preferably greater than, or equal to, 100 nm. It is preferred that the portion of each of the lines having the forward tapering side surface portion does not include an inversely tapering portion. On the portion 34C having such a cross-sectional shape, even though the organic barrier layer is not present, a first inorganic barrier layer 12C and a second inorganic barrier layer 16C with no void are formed.

In consideration of the process margin, the forward tapering side surface portion has a tapering angle smaller than 85 degrees, preferably smaller than, or equal to, 70 degrees. It is preferred that the rest of the lines has a tapering angle set to be larger than 85 degrees and 90 degrees or smaller. It is preferred that the difference in the tapering angles is larger than, or equal to, 15 degrees. There is no specific lower limit on the tapering angle of the forward tapering side surface portion. It is preferred that the tapering angle is larger than, or equal to, 30 degrees, for the following reasons. Even if the tapering angle is smaller than 30 degrees, there is no specific difference in the effect of suppressing the organic material from being located locally. Where the distance between the lines is constant, the resistance of the lines is increased; whereas where the resistance of the lines is constant, the distance between the lines is decreased. It is preferred that the gate bus lines, source bus lines, the lead wires and the terminals having such a cross-sectional shape are formed by dry etching. The tapering angle of the forward tapering side surface portion may be adjusted by the pattern of the multi-gray scale mask (half-tone mask or gray-tone mask), and the tapering angle of the rest of the lines may be adjusted by the dry etching conditions.

Embodiment 2

The method for producing the OLED display device in embodiment 1 includes, for example, the following steps. In at least a portion of each of the plurality of lead wires 30A, the forward tapering side surface portion is formed at least at a lowermost portion of each of two exposed side surfaces of the lead wire 30A. The forward tapering side surface portion is formed to have a tapering angle smaller than 90 degrees in a cross-section parallel to the line width direction of the lead wire 30A. Next, the first inorganic barrier layer 12A is formed selectively on the active region R1. Then, a vapor-like or mist-like acrylic monomer is supplied into the chamber. In the step of condensing the acrylic monomer on the first inorganic barrier layer 12A, the acrylic monomer is condensed so as not to be present on the portion of each lead wire 30A having the forward tapering side surface portion. The condensed acrylic monomer is irradiated with light (e.g., ultraviolet light) to form the organic barrier layer 14 of an acrylic resin.

The above-described method, by which the acrylic monomer is located locally, has a problem that the process margin is narrow. A method for producing an OLED display device in embodiment 2 described below includes a step of forming a resin layer (e.g., acrylic resin layer) also on a part of the flat portion and partially ashing the resin layer to form an organic barrier layer. As described below in detail with reference to FIG. 20, the film formation device 200 may be used to form the organic barrier layer for example, a vapor-like or mist-like photocurable resin is supplied into the chamber and is condensed on the element substrate to form a liquid film. Then, the liquid film of the photocurable resin is irradiated with light to form a photocurable resin layer. The resultant photocurable resin layer is partially ashed to form the organic barrier layer.

The organic barrier layer may be formed in any of various forms by adjusting an initial thickness of the resin layer to be formed (e.g., to less than 100 nm) and/or by adjusting the ashing conditions (including time). Namely, the organic barrier layer 14A included in the OLED display device 100A described in embodiment 1 may be formed, or an organic barrier layer (solid portion) covering a part of, or the entirety of, the flat portion may be formed. An organic barrier layer having a large area size provides an effect of improving the resistance against bending, but may decrease the moisture-resistance reliability in the second mode described below. The form of the organic barrier layer (solid portion) may be appropriately selected in accordance with the use thereof.

The structure of the element substrate before the TFE structure is formed, especially, the structure of the lead wires and the terminals, and the structure of the TFE structure, may be any of those described in embodiment 1.

Figure 6:
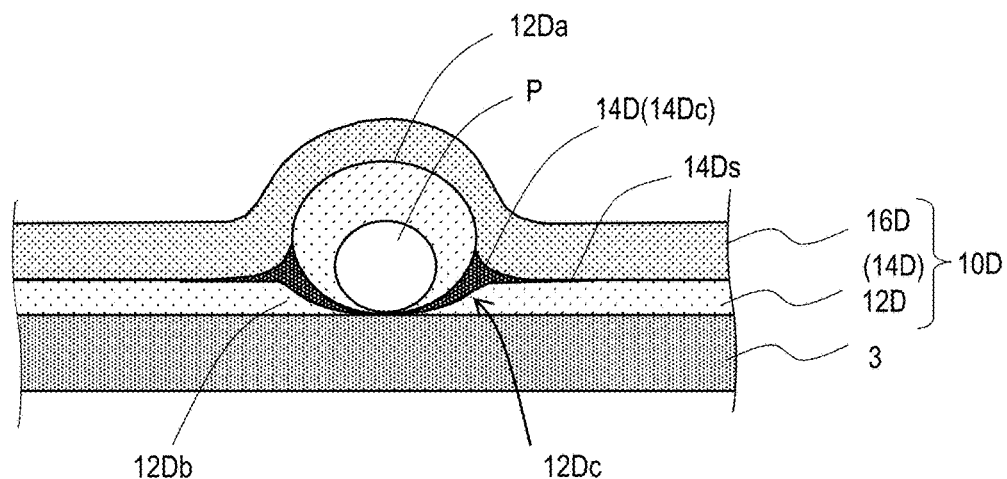
FIG. 6 include schematic partial cross-sectional views of a TFE structure 10D in an OLED display device in embodiment 2 according to the present invention.
Figure 6:
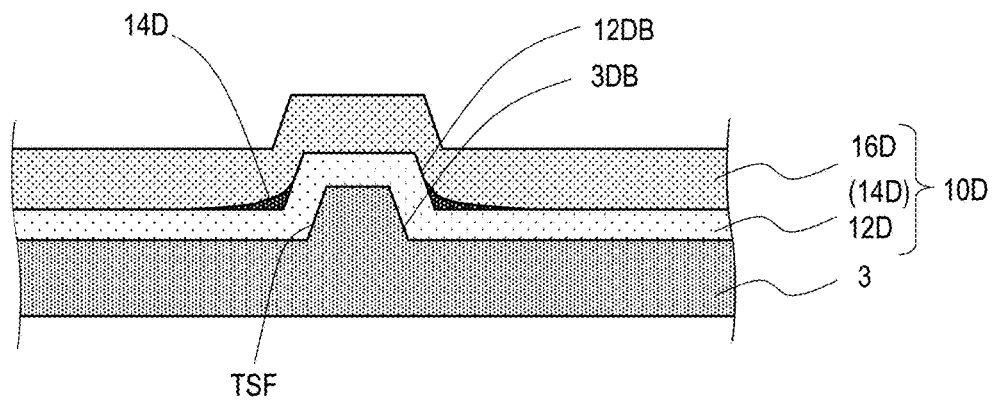
Figure 7:
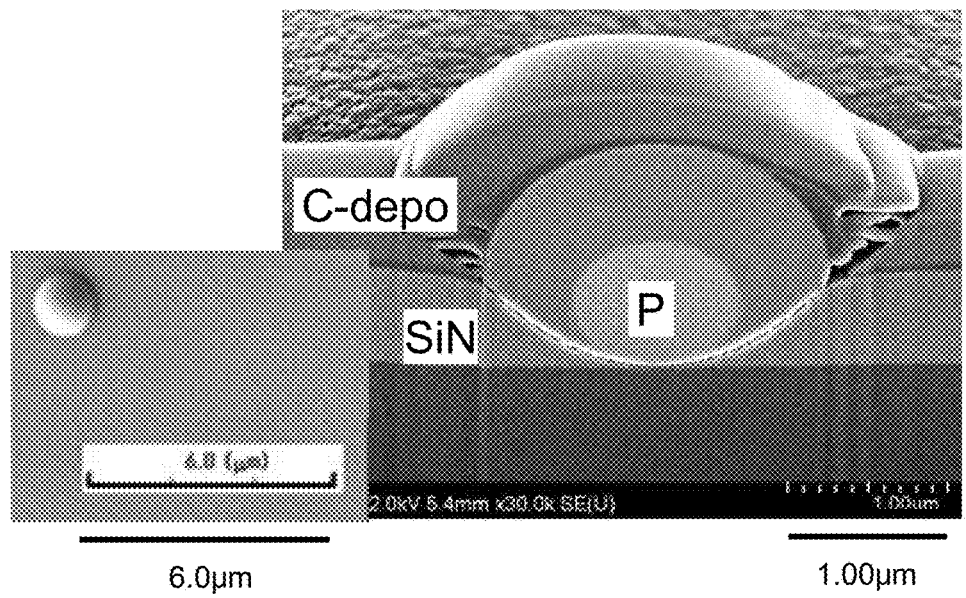
FIG. 7 shows an cross-sectional SEM image of a first inorganic barrier layer (SiN layer) covering a particle (silica sphere having a diameter of 1 μm, and also shows a planar SEM image (left bottom).

FIG. 6(a) is a schematic partial cross-sectional view of a TFE structure 10D in an OLED display device in embodiment 2 according to the present invention, and shows a portion including the particle P. As described above with reference to FIG. 4(c), in the case where the particle P is present, a crack (void) 12Dc may be formed in a first inorganic barrier layer 12D. Based on a cross-sectional SEM image shown in FIG. 7, this is considered to be caused by impingement of an SiN layer 12Da growing from a surface of the particle P and an SiN layer 12Db growing from the flat portion of the surface of the OLED 3. In the case where such a crack 12Da is present, the level of barrier property of the TFE structure 10D is decreased. The cross-sectional SEM image shown in FIG. 7 is of a sample of SiN film formed by plasma CVD in the state where a silica sphere having a diameter of 1 μm is located as the particle P on a glass substrate. The cross-section does not pass the center of the particle P. An outermost surface of the particle P is a carbon layer (C-depo) used to protect the sphere at the time of cross-section processing. As can be seen, mere presence of a relatively small silica sphere having a diameter of 1 μm results in the formation of the crack (void) 12Dc in the SiN layer 12D.

Figure 8:
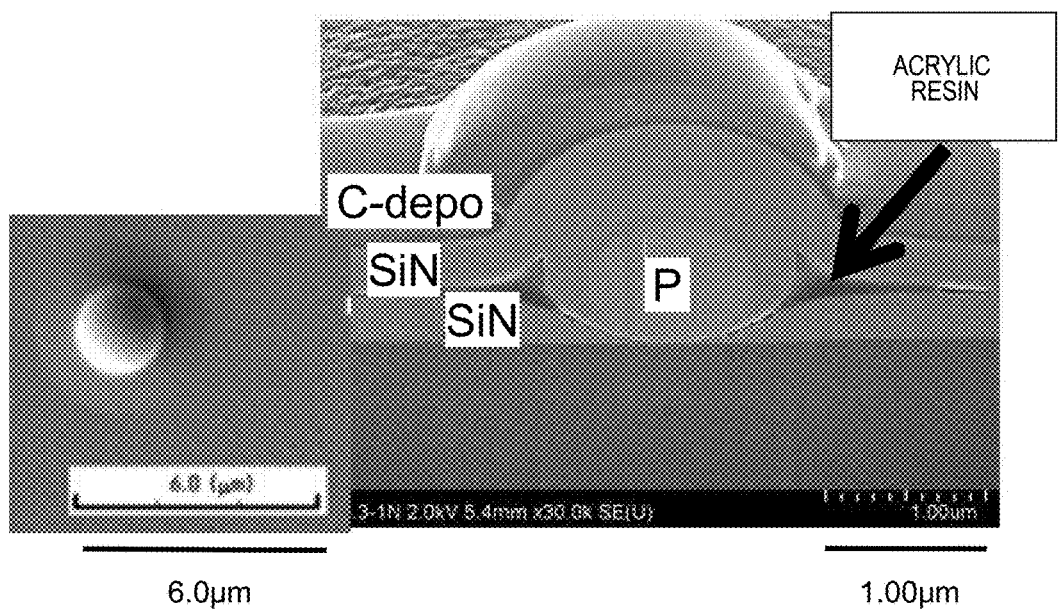
FIG. 8 shows an cross-sectional SEM image of a TFE structure covering a particle (silica sphere having a diameter of 2.15 μm, and also shows a planar SEM image (left bottom).

In the TFE structure 10D in the OLED display device in embodiment 2, as shown in FIG. 6(a), an organic barrier layer 14Dc is formed to fill the crack 12Dc of the first inorganic barrier layer 12D and a portion of the inorganic barrier layer 12D that is overhung by the particle P. Therefore, the level of barrier property is kept high by a second inorganic barrier layer 16D. This may be confirmed by a cross-sectional SEM image shown in FIG. 8. In FIG. 8, no interface is observed at a position where the second inorganic barrier layer 16D is formed directly on the first inorganic barrier layer 12D. In the schematic view, however, the first inorganic barrier layer 12D and the second inorganic barrier layer 16D are shown with different types of hatching for easier understanding.

The cross-sectional SEM image shown in FIG. 8 is of a sample of the TFE structure 10D formed in the state where a silica sphere having a diameter of 2.15 μm is located on a glass substrate, like the cross-sectional SEM image shown in FIG. 7. As can be seen from a comparison between FIG. 7 and FIG. 8, the diameter of the particle P shown in FIG. 8 is about twice the diameter of the particle P shown in FIG. 7. Even in the case of FIG. 8, the SiN film formed on the acrylic resin layer is a fine film with no void. The acrylic resin layer has a recessed surface, which shows a high level of wettability to the SiN film.

Another sample may be formed as follows. An SiN film is formed by plasma CVD so as to cover the particles P (silica spheres having a diameter of 2.15 μm and a diameter of 4.6 μm, and then an acrylic resin layer is formed as the organic barrier layer 14D. Then, another SiN film is formed by plasma CVD. Like in the case of FIG. 7, in this sample also, the SiN film formed on the acrylic resin layer has been observed by an SEM to be a fine film with no void.

As described below, the organic barrier layer 14D shown in FIG. 6(a) is formed of, for example, an acrylic resin. It is especially preferred that the organic barrier layer is formed by curing an acrylic monomer (acrylate) having a viscosity of about 1 to about 100 mPa·s at room temperature (e.g., 25° C.) by light (e.g., ultraviolet light). An acrylic monomer having such a low viscosity may easily fill the crack 12Dc and the portion overhung by the particle P. The acrylic resin has a high visible light transmittance and thus is preferably usable for a top emission-type OLED display device. A photoinitiator may be optionally incorporated into the acrylic monomer. The photosensitive wavelength may be adjusted by the type of the photoinitiator. The acrylic monomer may be replaced with another photocurable resin. A preferred photocurable resin is an ultraviolet-curable resin from the point of view of the reactivity and the like. The ultraviolet light to be directed toward the resin is preferably near ultraviolet light (200 nm or longer and 400 nm or shorter), and is especially preferably near ultraviolet light in the UV-A region having a wavelength of 315 nm or longer and 400 nm or shorter. Alternatively, ultraviolet light having a wavelength of 300 nm or longer and shorter than 315 nm may be used. Still alternatively, a photocurable resin curable by bluish purple to blue visible light having a wavelength of 400 nm or longer and 450 nm or shorter may be used.

A surface of the organic barrier layer 14Da filling the crack 12Dc and the portion overhung by the particle P couples a surface of the first inorganic barrier layer 12Da on the particles P and a surface of the organic barrier layer 14D formed on the flat portion of the surface of the OLED 3 to each other continuously and smoothly. Therefore, the second inorganic barrier layer (SiN layer) 16D formed on the first inorganic barrier layer 12Da on the particle P and the organic barrier layer 14D is fine with no void.

A surface 14Ds of the organic barrier layer 14D is oxidized by ashing, and thus is hydrophilic and highly adhesive to the second inorganic barrier layer 16D.

The organic barrier layer 14D is formed a process including ashing. The ashing may be varied in the plane. Therefore, a portion of the organic barrier layer 14D that is formed on the flat portion may be completely removed to expose the surface of the first inorganic barrier layer 12D.

If the organic barrier layer 14D is formed on the entirety of the flat portion, the organic barrier layer 14D on the flat portion acts as a moisture entrance route to decrease the moisture-resistance reliability of the OLED display device. In order to avoid this, the OLED display device in embodiment 2 has the structure as shown in FIG. 6(b). An underlying surface for the organic barrier layer 14D (e.g., surface of the OLED 3) includes a bank 3DB substantially enclosing the active region, and the bank 3DB has a forward tapering side surface portion TSF at a lowermost portion of each of two exposed side surfaces thereof. The forward tapering side surface portion TSF has a tapering angle smaller than 90 degrees in a cross-section of the bank 3DB parallel to a width direction thereof. It is preferred that the forward tapering side surface portion TSF has a height (length in a direction normal to the substrate) that is greater than the thickness of the organic material (approximately equal to the thickness of the organic barrier layer 14D), for example, greater than, or equal to, 50 nm, preferably greater than, or equal to, 100 nm.

The first inorganic barrier layer 12D formed on the bank 3DB also includes a bank 12DB. Therefore, a non-solid portion of the organic barrier layer 14D is formed, but no solid portion is present, on the bank 3DB. Namely, the first inorganic barrier layer 12D and the second inorganic barrier layer 16D are in direct contact with each other to form the inorganic barrier layer joint portion on the bank 3DB. A portion of the lead wire (having the same structure as that of the lead wire 30A in embodiment 1) that is on the bank 3DB is located to have a forward tapering side surface portion TSF, and no solid portion of the organic barrier layer 14D is present on the bank 3DB. Therefore, in the OLED display device in embodiment 2, although the organic barrier layer 14D is provided on the flat portion, the active region is completely enclosed by the inorganic barrier layer joint portion. Therefore, the OLED display device in embodiment 2 has a high level of moisture-resistance reliability.

The bank 3DB may be formed by any of various methods. For example, in a step of forming the circuit 2, a bank defining the pixels including the OLEDs 3 is formed of a photosensitive resin (e.g., polyimide or acrylic resin). In this step, the bank 3DB enclosing the active region R1 may be formed concurrently. Alternatively, in a step of patterning a gate metal layer and/or a source metal layer to form the gate bus lines and/or the source bus lines, a pattern enclosing the active region (pattern for the bank 3DB) may be formed concurrently. In this step, the pattern for the bank 3DB may be formed by use of a multi-gray scale mask shaped in accordance with the opening, so that the pattern has the forward tapering side surface portion.

Figure 9:
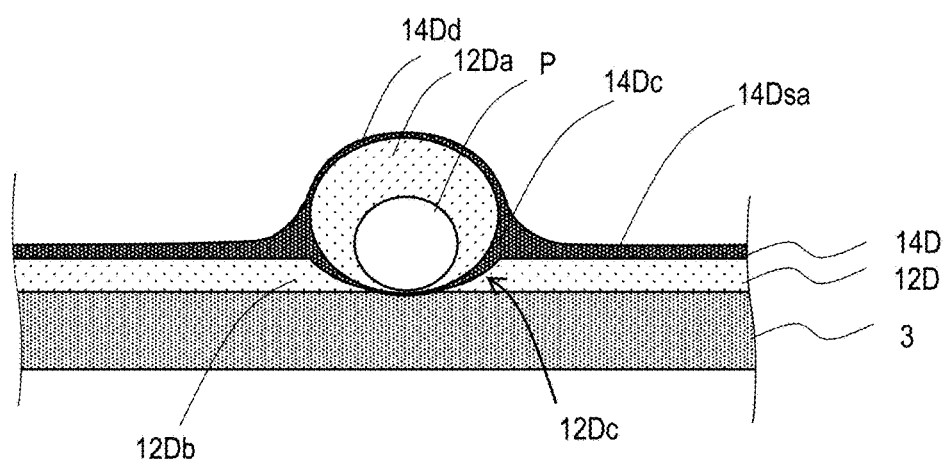
FIG. 9(a) through FIG. 9(c) are schematic cross-sectional views provided to illustrate a step of forming the organic barrier layer 14D.
Figure 9:
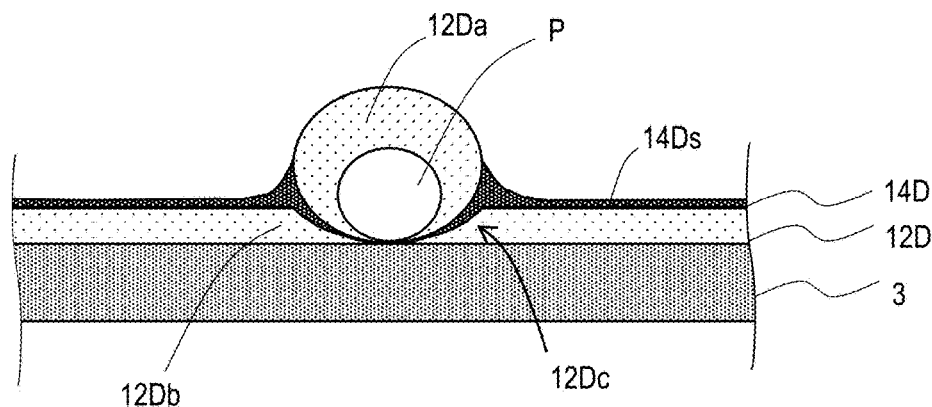
Figure 9:
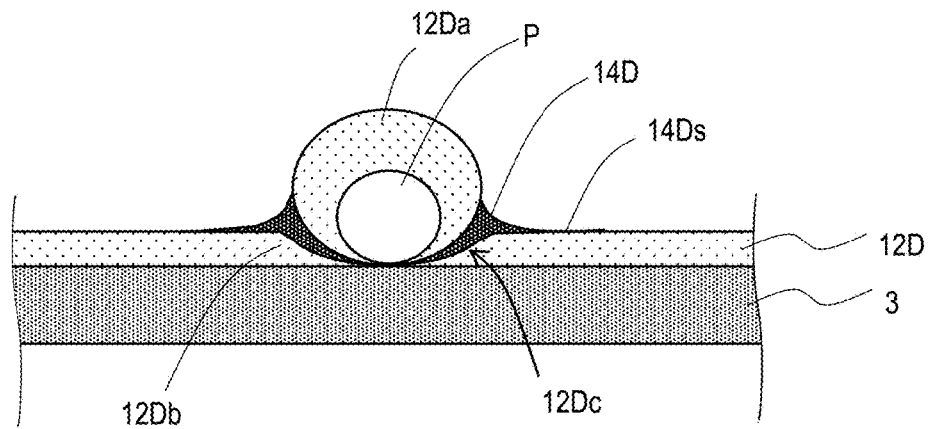
Figure 10:
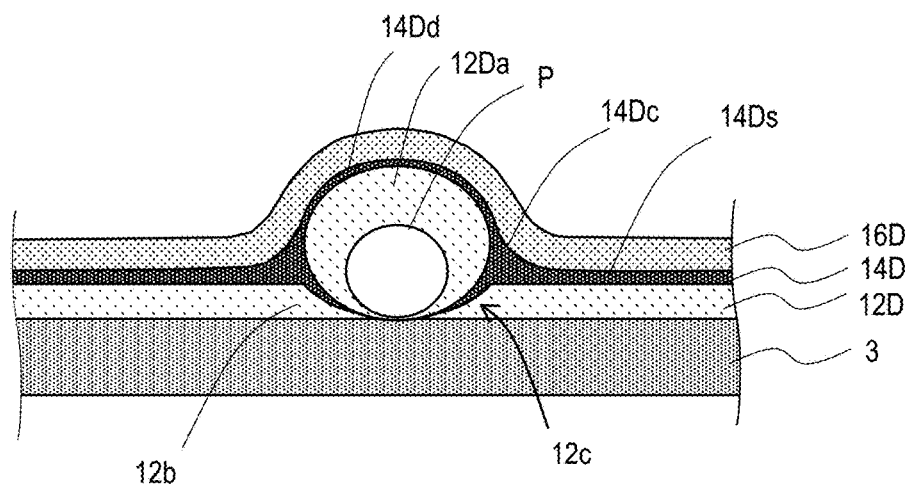
FIG. 10(a) through FIG. 10(a) are schematic cross-sectional views provided to illustrate a step of forming a second inorganic barrier layer 16D.
Figure 10:
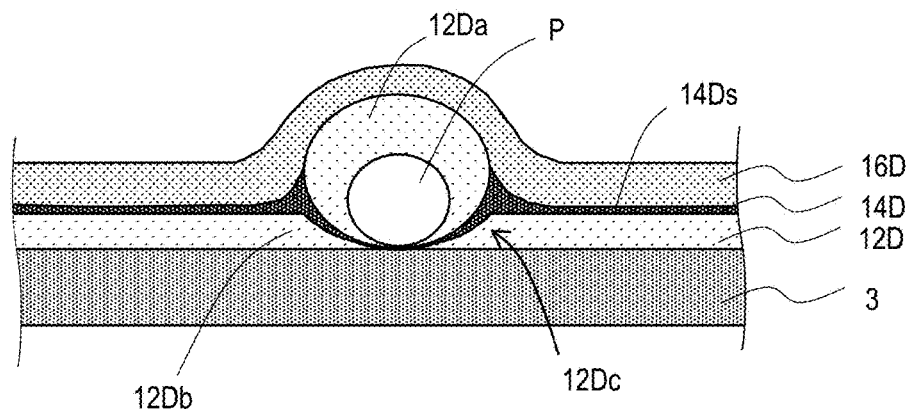
Figure 10:
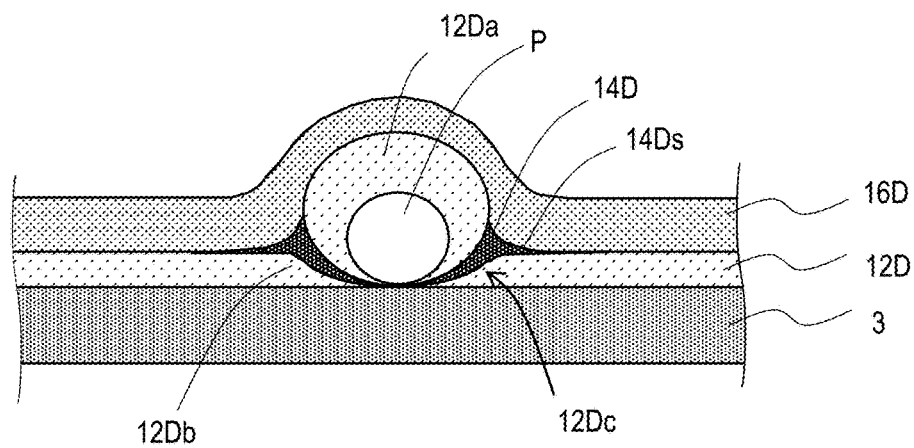

With reference to FIG. 9 and FIG. 10, a step of forming the organic barrier layer 14D and the second inorganic barrier layer 16D, especially, the step of ashing, will be described. FIG. 9 shows the step of forming the organic barrier layer 14D, and FIG. 10 shows the step of forming the second inorganic barrier layer 16D.

As schematically shown in FIG. 9(a), the first inorganic barrier layer 12D covering the particle P on the surface of the OLED 3 is formed, and then the organic barrier layer 14D is formed on the first inorganic barrier layer 12D. The organic barrier layer 14D is formed by, for example, condensing a vapor-like or mist-like acrylic monomer on a cooled element substrate and then irradiating the acrylic monomer with light (e.g., ultraviolet light) to cure the acrylic monomer. An acrylic monomer having a low viscosity may be used so as to fill the crack 12Dc formed in the first inorganic barrier layer 12D.

FIG. 9(a) shows an example in which an organic barrier layer 14Dd is formed on the first inorganic barrier layer 12Da on the particle P. The acrylic monomer may not be deposited (or attached), or may be deposited (or attached) in merely a trace amount, on the first inorganic barrier layer 12Da on the particle P, in the case where the particle P is of a certain size or a certain shape or in the case where the acrylic monomer is of a certain type. The organic barrier layer 14D may be formed by use of, for example, the film formation device 200 shown in FIG. 20 and described below. The organic barrier layer 14D is adjusted to have an initial thickness of 100 nm or greater and 500 nm or less on the flat portion. The organic barrier layer 14D in the initial state thus formed has a surface 14Da, which is smoothly continuous and hydrophobic. For the sake of simplicity, the organic barrier layer in a pre-ashing state bears the same reference sign as that of the organic barrier layer in a post-ashing state.

Then, as shown in FIG. 9(b), the organic barrier layer 14D is ashed. The ashing may be performed by use of a known plasma ashing device, a known photoexcitation ashing device, or a known UV ozone ashing device. For example, plasma ashing using at least one type of gas among $N_2O$, $O_2$ and $O_3$, or a combination of such plasma ashing and ultraviolet light irradiation, may be performed. In the case where an SiN film is formed by CVD as each of the first inorganic barrier layer 12D and the second inorganic barrier layer 16D, $N_2O$ is used as a material gas. Therefore, use of $N_2O$ for the ashing provides an advantage that the device is simplified.

In the case where the ashing is performed, the surface 14Da of the organic barrier layer 14D is oxidized and thus is modified to be hydrophilic. In addition, the surface 14Ds is shaved almost uniformly, and extremely tiny convexed and concaved portions are formed, which increases the surface area size. The effect of increasing the surface area size provided by the ashing is greater for the surface of the organic barrier layer 14D than for the first inorganic barrier layer 12D formed of an inorganic material. Since the surface 14Ds of the organic barrier layer 14D is modified to be hydrophilic and the surface area size of the surface 14Ds is increased, the adhesiveness of the organic barrier layer 14D with the second inorganic barrier layer 16D is improved.

When the ashing is further advanced, the organic barrier layer 14D formed of an island-like solid portion is formed as shown in FIG. 9(c).

When the ashing is still further advanced, the organic barrier layer 14Da may be left only in the crack 12Dc of the first inorganic barrier layer 12D and in the vicinity of the portion of the first inorganic barrier layer 12D that is overhung by the particle P, like the organic barrier layer 14A shown in FIG. 4(a). In this state, the surface of the organic barrier layer 14Dc couples the surface of the first inorganic barrier layer 12Da on the particle P and the surface of the flat portion of the OLED 3 to each other continuously and smoothly.

In order to improve the adhesiveness between the first inorganic barrier layer 12D and the organic barrier layer 14D, the surface of the first inorganic barrier layer 12D may be ashed before the organic barrier layer 14D is formed.

Now, with reference to FIG. 10, the structure after the second inorganic barrier layer 16D is formed on the organic barrier layer 14D will be described.

FIG. 10(a) schematically shows a structure provided as follows: the surface 14Dsa of the organic barrier layer 14D shown in FIG. 9(a) is oxidized by ashing and thus is modified to be hydrophilic, and then the second inorganic barrier layer 16D is formed. In this example, the surface 14Dsa of the organic barrier layer 14D is slightly ashed, so that the organic barrier layer 14Dd is left on the first inorganic barrier layer 12Da on the particle P. Alternatively, there may be a case where the organic barrier layer 14D is not formed (or is not left) on the first inorganic barrier layer 12Da on the particle P.

As shown in FIG. 10(a), the second inorganic barrier layer 16D formed on the organic barrier layer 14D has no void, and is highly adhesive with the organic barrier layer 14D.

As shown in FIG. 10(b) and FIG. 10(a), the second inorganic barrier layer 16D formed on the organic barrier layer 14D shown in FIG. 9(b) and FIG. 9(c) has no void and is highly adhesive with the organic barrier layer 14D. Even though the organic barrier layer 14D is completely removed from the flat portion of the OLED 3, the second inorganic barrier layer 16D has no void and is highly adhesive with the organic barrier layer 14D as long as the surface of the organic barrier layer 14D couples the surface of the first inorganic barrier layer 12Da on the particle P and the surface of the flat portion of the OLED 3 to each other continuously and smoothly.

As shown in FIG. 10(b), the organic barrier layer 14D may be ashed so as to be left in a small thickness on the entirety of the surface of the first inorganic barrier layer except for the protruding portion, namely, the first inorganic barrier layer 12Da formed on the particle P. From the point of view of the resistance against bending, it is preferred that the thickness of the organic barrier layer 14D on the flat portion is 10 mm or greater and less than 200 nm. Herein, the "thickness of a liquid film of a photocurable resin (or a photocurable resin film)" refers to the thickness of a flat portion. A liquid film forms a flat (horizontal) surface. Therefore, in the case where the underlying layer has a recessed portion, the liquid film has a larger thickness in that portion. Since the liquid film forms a curved surface by a surface tension (encompassing a capillary action), the thickness of the liquid film in the vicinity of the protruding portion is larger. Such a locally larger thickness of the liquid film may exceed 500 nm.

However, in the case where the organic barrier layer 14D (solid portion) is formed in a large area continuously, the moisture-resistance reliability is decreased in the second mode described below. As shown in FIG. 10(c), it is preferred that the solid portion is enclosed by the inorganic barrier layer joint portion. Namely, it is preferred that the organic barrier layer 14D is formed of island-like solid portions discretely distributed. It is also preferred that the inorganic barrier layer joint portion enclosing the island-like solid portions has a width greater than, or equal to, 2 mm.

Figure 11:
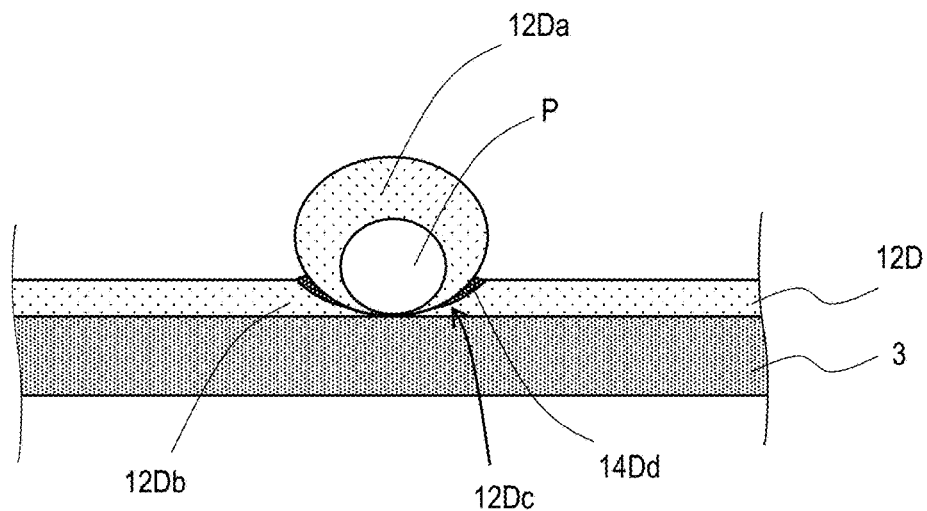
FIG. 11 is a schematic cross-sectional view showing an organic barrier layer 14Dd excessively ashed.
Figure 12:
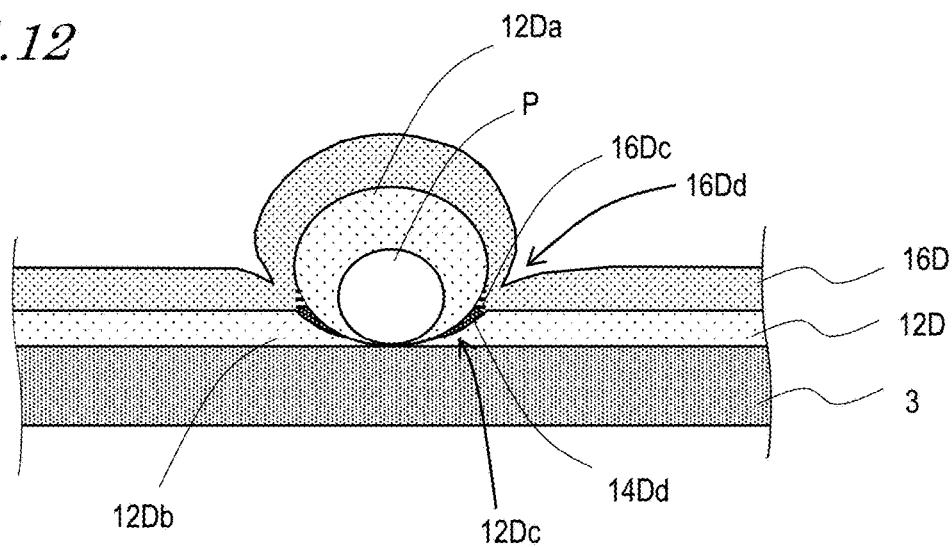
FIG. 12 is a schematic cross-sectional view showing the second inorganic barrier layer 16D formed on the organic barrier layer 14Dd excessively ashed.

In the case where the organic barrier layer 14D is ashed excessively, as shown in FIG. 11, the organic barrier layer 14D formed on the flat portion of the OLED 3 is completely removed, and further the organic barrier layer 14Dd filling the crack 12Da formed by the particle P is decreased in size and fails to make the surface of the underlying layer for the second inorganic barrier layer 16D continuous and smooth. As a result, as shown in FIG. 12, a void 16Dc is formed in the second inorganic barrier layer 16D, which decreases the level of barrier property of the TFE structure. Even if the void 16Dc is not formed, if an acute recessed portion 16Dd is formed at the surface of the second inorganic barrier layer 16D, a stress tends to concentrate at the acute recessed portion 16Dd, which causes a crack to be generated easily by an external force.

In an experiment in which, for example, a silica convex lens (diameter: 4.6 μm) was used as the particle P, there was a case where the organic barrier layer was etched excessively at an end of the silica convex lens, and as a result, the second inorganic barrier layer was made extremely thin partially. In such a case, the second inorganic barrier layer, even if having no void, may be cracked when an external force is applied to the TFE structure during or after the production of the OLED display device.

An external force may be applied to the TFE structure in the following cases, for example. When the flexible substrate 1 of the OLED display device is peeled off from a glass substrate as a support substrate, a bending stress acts on the OLED display device including the TFE structure 10. When, during the production of a curved-surface display, the OLED display device is bent along a predetermined curved shape, a bending stress acts on the TFE structure 10. Needless to say, the flexibility of the OLED display device is utilized while the OLED display device is used (for example, the OLED display device is folded, bent or rolled), various types of stress are applied to the TFE structure 10 during the use of the OLED display device by the user.

The method for producing the OLED display device in embodiment 2 includes a step of preparing, in the chamber, the OLED 3 on which the first inorganic barrier layer 12D is formed, a step of supplying a vapor-like or mist-like photocurable resin (e.g., acrylic monomer) into the chamber, a step of condensing the photocurable resin on the first inorganic barrier layer 12D to form a liquid film, a step of irradiating the liquid film of the photocurable resin with light to form a photocurable resin layer (cured resin layer), and a step of partially ashing the photocurable resin layer to form the organic barrier layer 14D. An ultraviolet-curable resin is preferably usable as the photocurable resin. Nonetheless, this method is applied also to a visible light-curable resin as long as a light source emitting light of a predetermined wavelength that cures the photocurable resin is used. The method for producing the OLED display device in embodiment 2 will be described in detail below with reference to FIG. 20.

In each of embodiments 1 and 2, an OLED display device including a thin film encapsulation structure that includes an inorganic barrier layer joint portion enclosing an active region is produced. In embodiment 2, how much of the organic barrier layer is to be left may be optionally changed in accordance with the use of the OLED display device or the degree of requirement of the organic barrier layer.

[Second Mode]

Now, the second mode among the two modes in which the water vapor in the air is caused to reach the inside of the active region via the organic barrier layer will be described.

First, with reference to FIG. 13(a) and FIG. 13(b), the second mode in which the water vapor in the air reaches the inside of the active region via the organic barrier layer will be described.

Figure 13:
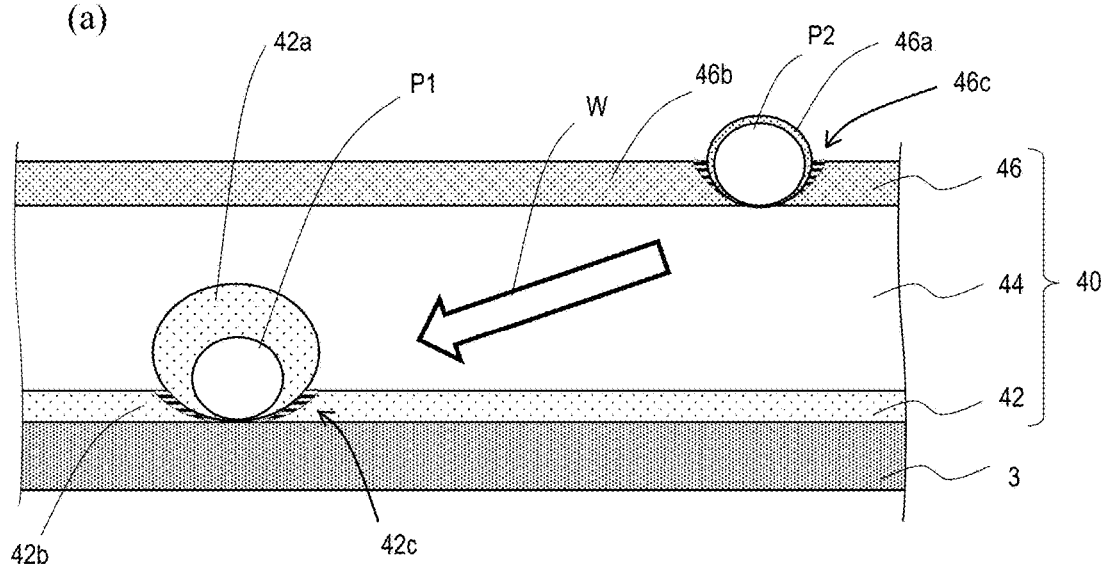
FIG. 13(a) and FIG. 13(b) are respectively schematic cross-sectional views of a conventional TFE structure 40 and a TFE structure 10DX as a reference example, that are provided to illustrate a second mode in which water vapor in the air is caused to reach the inside of the active region via an organic barrier layer.
Figure 13:
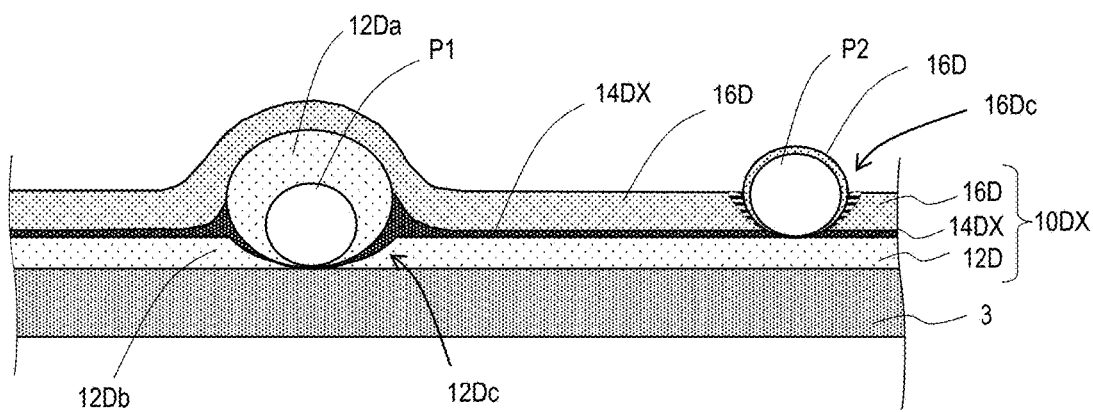

FIG. 13(a) is a schematic cross-sectional view of a conventional TFE structure 40. The conventional TFE structure includes a first inorganic barrier layer 42, an organic barrier layer 44 and a second inorganic barrier layer 46. The organic barrier layer 44 is formed by, for example, a printing method such as an inkjet method or the like, and is formed only on the active region of the element substrate. Therefore, the moisture-resistance reliability is not considered to be decreased in the first mode described above.

However, studies made by the present inventor have found that in the case where a particle P2 is generated during the formation of the second inorganic barrier layer 46, the moisture-resistance reliability is decreased. The particle that is present from before the first inorganic barrier layer 42 or the second inorganic barrier layer 46 is formed will be represented by reference sign P1, whereas the particle that is generated during the formation of the first inorganic barrier layer 42 or the second inorganic barrier layer 46 will be represented by reference sign P2.

When the first inorganic barrier layer 42 is formed on the particle P1 present from before the first inorganic barrier layer 42 is formed, a portion 42a growing from a surface of the particle P1 and a portion 42b growing from the flat portion of the OLED 3 impinge against each other, resulting in the formation of a crack 42c. Similarly, when the particle P2 is generated during the formation of the second inorganic barrier layer 46, a void (e.g., crack) 46c is formed in the second inorganic barrier layer 46. Since the particle P2 is formed during the formation of the second inorganic barrier layer 46, a portion 46a, of the second inorganic barrier layer 46, formed on the particles P2 is shown as being thinner than a portion 46b formed on the flat portion.

Through the void 46c, the vapor in the air enters the organic barrier layer 44. The organic barrier layer 44 has a water vapor barrier property of a level lower than that of the first inorganic barrier layer 42 and the second inorganic barrier layer 46. Therefore, the moisture permeates through the organic barrier layer 44 as represented by arrow W to reach the crack 42c of the first inorganic barrier layer 42. Although the time required for the moisture to reach the crack 42c from the void 46c is extended by the presence of the organic barrier layer 44, there are cases where a sufficient level of moisture-resistance reliability is not provided.

This is also applicable to the TFE structure including a relatively thin organic barrier layer described in each of embodiments 1 and 2. FIG. 13(b) is a schematic cross-sectional view of a TFE structure 10DX in a reference example. As shown in FIG. 13(b), in the case where a solid portion of an organic barrier layer 14DX is present continuously between the crack 12Dc of the first inorganic barrier layer 12D and the void 16Dc of the second inorganic barrier layer 16D, a sufficient level of moisture-resistance reliability may not be provided.

An OLED in an embodiment according to the present invention described below solves the above-described problem of the TFE structure including a relatively thin organic barrier layer.

Figure 14:
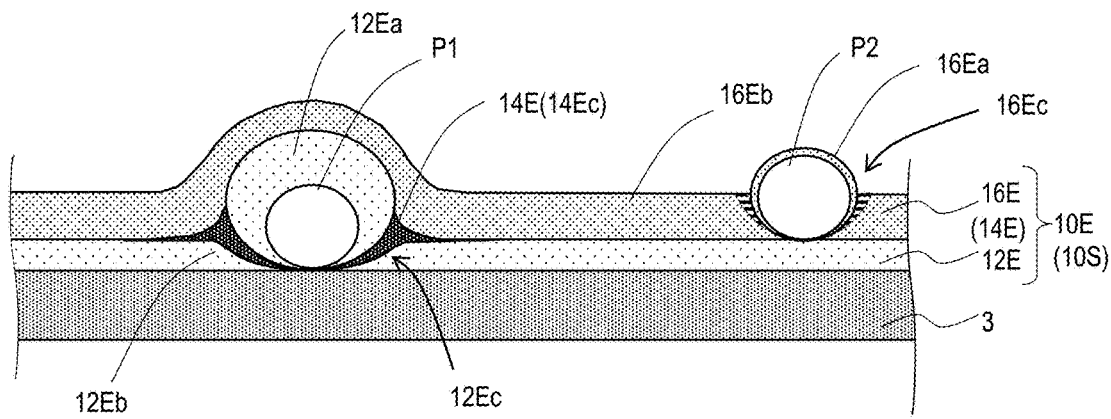
FIG. 14 is a schematic partial cross-sectional view of a TFE structure 10E in an OLED display device in embodiment 3 according to the present invention.

FIG. 14 is a schematic partial cross-sectional view of a TFE structure 10E in an OLED display device in embodiment 3 according to the present invention.

A solid portion of an organic barrier layer 14E included in the TFE structure 10E is formed in a ring shape (donut shape) around the particle P1, as described above with reference to FIG. 4(b). It is preferred that where the particle P1 has a diameter (measured value converted into a diameter of a circle) of about 1 µm, the ring-shaped solid portion has the diameter $D_0$ (measured value converted into a diameter of a circle) that is, for example, longer than, or equal to, 2 µm.

An organic barrier layer 14Ec is formed to fill a crack 12e formed between a portion 12Ea, of a first inorganic barrier layer 12E, growing from the surface of the particle P1 and a portion 12Eb, of the first inorganic barrier layer 12E, growing from the flat portion and also to fill a portion overhung by the particle P1, and thus has a recessed surface. The recessed surface of the organic barrier layer 14E couples a surface of the first inorganic barrier layer 12Ea on the particle P1 and a surface of the first inorganic barrier layer 12Eb on the flat portion of the OLED 3 to each other continuously and smoothly. Therefore, no void is formed in the second inorganic barrier layer 16E covering the particle P1. The solid portion of the organic barrier layer 14E is enclosed by the inorganic barrier layer joint portion, where the first inorganic barrier layer 12E and the second inorganic barrier layer 16E are in direct contact with each other. Therefore, although the moisture tends to enter the organic barrier layer 14E through a void 16Ec formed between a portion 16Ea, of the second inorganic barrier, layer 16E, growing from a surface of the particle P2 and a portion 16Eb, of the second inorganic barrier layer 16E, growing from the flat portion, such moisture is suppressed and prevented from reaching the organic barrier layer 14E.

Figure 15:
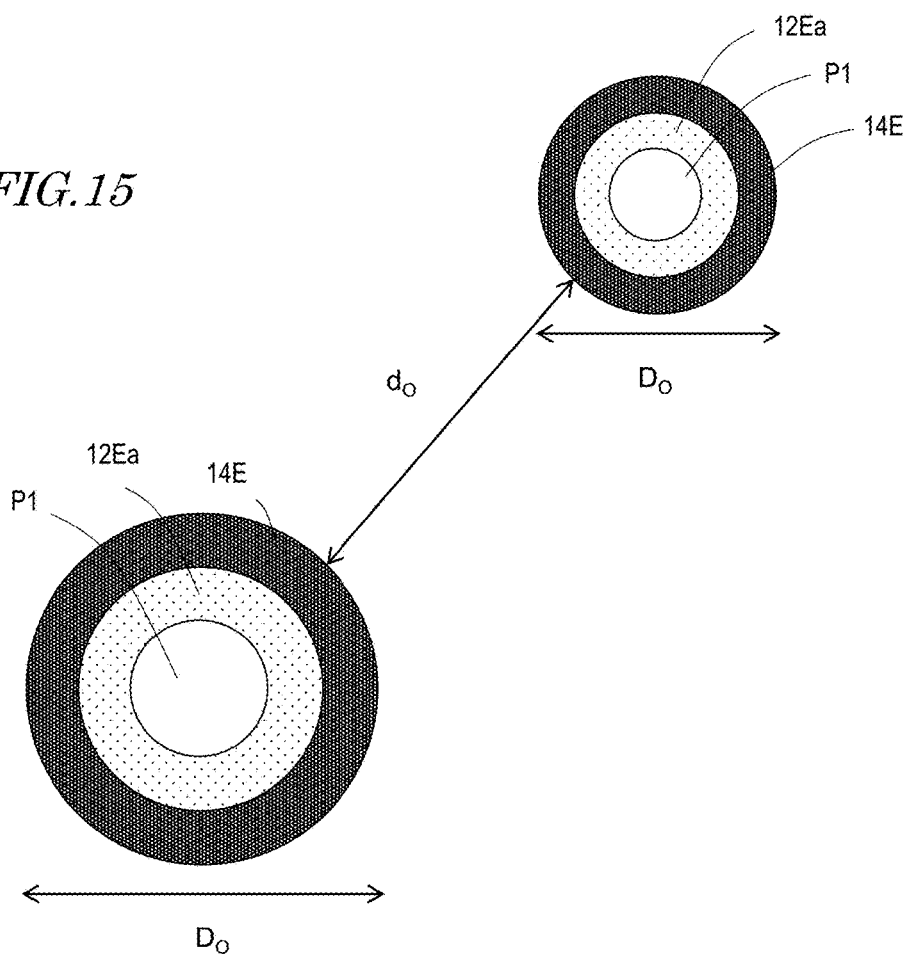
FIG. 15 is a schematic plan view provided to illustrate a preferable diameter $D_0$ of an organic barrier layer 14E in the TFE structure 10E and a preferable distance do between two adjacent solid portions of the organic barrier layer 14E.

In this state, as shown in FIG. 15, it is preferred that a distance do between two adjacent island-like solid portions, among a plurality of island-like solid portions 14E discretely distributed, is longer than, or equal to, 2 mm. Namely, it is preferred that the island-like solid portions 14E are each enclosed by an inorganic barrier layer joint portion having a width longer than, or equal to, 2 mm. With such a structure, the decrease in the moisture-resistance reliability caused by the water vapor in the air reaching the inside of the active region via the organic barrier layer 14E is suppressed.

In a plasma CVD device for mass production studied by the present inventor, the particles P2 having a diameter shorter than, or equal to, 1 µm are generated at a frequency lower than, or equal to, about one in an 8 mm×8 mm area. By contrast, during the formation of the OLED 3, namely, before the TFE structure 10 is formed, various types of particles P1 having a diameter exceeding 1 µm are generated at a frequency lower than, or equal to, about one in an 100 mm×100 mm area. Therefore, as long as the island-like solid portions of the organic barrier layer 14E are each enclosed by an inorganic barrier layer joint portion having a width longer than, or equal to, 2 mm, namely, as long as the distance do between two adjacent island-like solid portions is longer than, or equal to, 2 mm, the probability at which the solid portions of the organic barrier layer 14E are present in a row between two adjacent particles P1 and P2 is considered to be decreased to a level sufficient for practical use.

Hereinafter, a stack structure including the first inorganic barrier layer, the organic barrier layer in contact with a top surface of the first inorganic barrier layer, and the second inorganic barrier layer in contact with a top surface of the organic barrier layer will be referred to as a "complex stack body (10S)". Namely, the above-described TFE structures 10A through 10E each have one complex stack body 10S.

Figure 16:
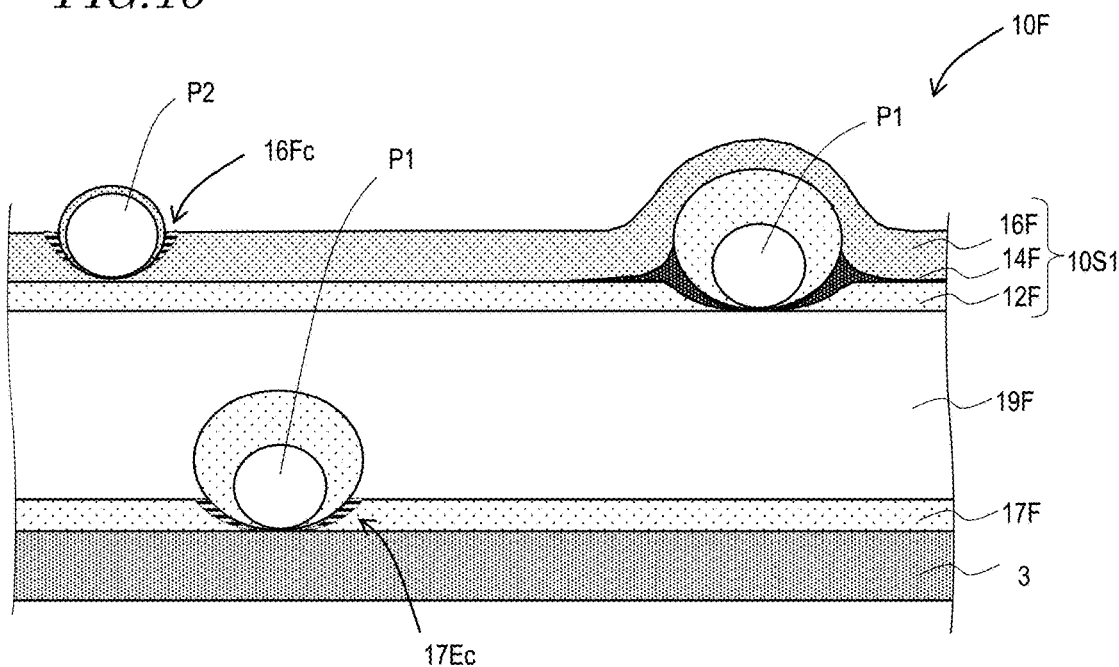
FIG. 16 is a schematic partial cross-sectional view of a TFE structure 10P in an OLED display device in embodiment 4 according to the present invention.
Figure 17:
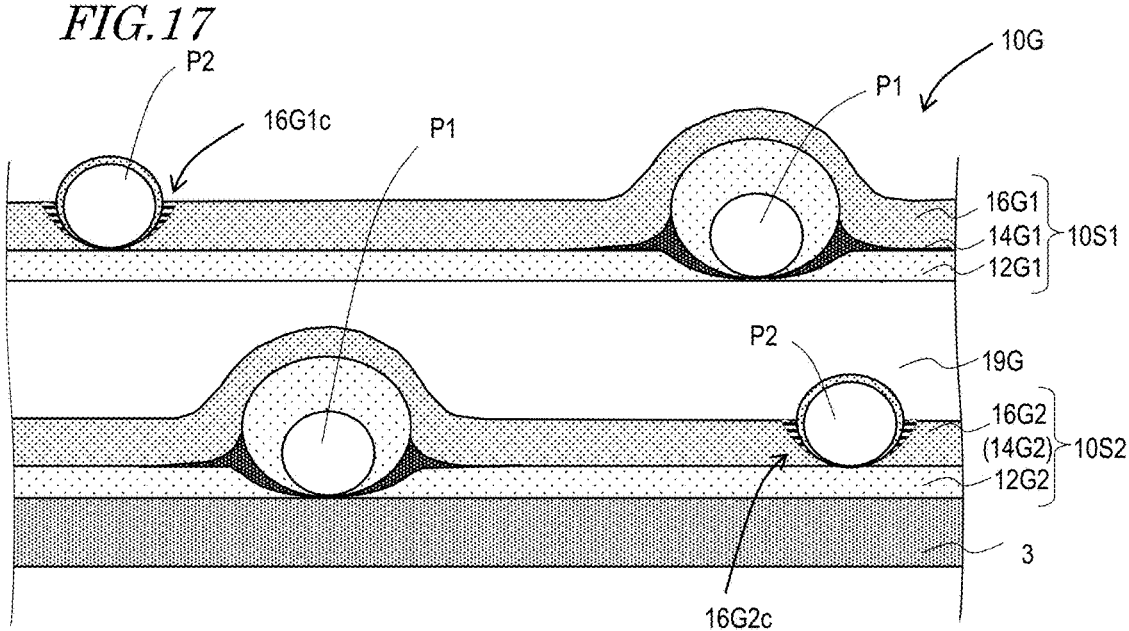
FIG. 17 is a schematic partial cross-sectional view of a TFE structure 10G in an OLED display device in embodiment 5 according to the present invention.

In order to suppress the moisture-resistance reliability from being decreased in the second mode, the OLED display device may include at least one complex stack body 10S, which has substantially the same structure as that of the TFE structure 10E shown in FIG. 14. With reference to FIG. 16 and FIG. 17, other examples of such a thin film encapsulation structure will be described.

FIG. 16 is a schematic partial cross-sectional view of a TFE structure 10F in an OLED display device in embodiment 4 according to the present invention.

The TFE structure 10F includes an inorganic underlying layer 17F, an organic flattening layer 19F formed on the inorganic underlying layer 17F, and a complex stack body 10S1 formed so as to be in contact with a top surface of the organic flattening layer 19F. The complex stack body 10S1 includes a first inorganic barrier layer 12F, an organic barrier layer 14F and a second inorganic barrier layer 16F, and thus has substantially the same structure as that of the complex stack body 10S (TFE structure 10E) shown in FIG. 14. Therefore, the moisture tending to enter the organic barrier layer 14F through a void 16Fc in the second inorganic barrier layer 16F is blocked by an inorganic barrier layer joint portion, where the first inorganic barrier layer 12F and the second inorganic barrier layer 16F are in direct contact with each other, and thus is suppressed and prevented from reaching the organic barrier layer 14F.

The organic flattening layer 19F is formed inner to the inorganic underlying layer 17F and the complex stack body 10S1, and the inorganic underlying layer 17F and the first inorganic barrier layer 12F of the complex stack body 10S1 are directly joined with each other along an outer periphery of the organic flattening layer 19F. Therefore, the moisture in the air is suppressed and prevented from reaching the active region via the organic flattening layer 19F.

Even in a rare case where a particle (not shown) having a diameter longer than or equal to, 3 μm is generated during the formation of the OLED 3, the organic flattening layer 19F compensates for the convexed and concaved portions caused by the particle to provide a flat surface. Therefore, the complex stack body 10S1 with no void is formed on the organic flattening layer 19F.

Most of the particles P1 and/or P2 generated during the formation of the inorganic layers (first inorganic barrier layer and the second inorganic barrier layer) by mask CVD have a diameter shorter than 3 μm. The number of such particles having a diameter exceeding 1 μm is smaller by approximately one digit than the number of such particles having a diameter shorter than, or equal to 1 μm. Generation of, especially, the particles having a diameter exceeding 1 μm is suppressed by managing the mask or the like. By contrast, it is difficult to substantially eliminate the particles P1 or P2 having a diameter shorter than, or equal to 1 μm. Therefore, a thin film encapsulation structure that keeps high the level of moisture-resistance reliability even if there are particles P1 or P2 having a diameter shorter than, or equal to 1 μm is desired. The above-described TFE structures 10A through 10E satisfy such conditions.

However, there may be a very rare case where a particle having a diameter exceeding 3 μm is generated during the formation of the OLED 3. Even in such a case, the organic flattening layer 19F allows the complex stack body 10S1 with no void to be formed. It is preferred that the organic flattening layer 19F has a thickness greater than, or equal to, 3 μm. In the case where a certain production method is used, the organic flattening layer 19F may have a thickness of 5 μm or greater and 20 μm or less.

The organic flattening layer 19F is formed by a known printing method or film formation method such as, for example, an inkjet method, a screen printing method, a slot coating method or the like. The organic flattening layer 19F does not need to be formed of a costly material as used in a conventional inkjet method. A reason for this is that the complex stack body 10S1 is formed on the organic flattening layer 19F. The organic flattening layer 19F is formed of, for example, a photocurable resin or a thermosetting resin. From the point of view of the mass-productivity, it is preferred to use a photocurable resin, especially, an ultraviolet-curable resin.

Examples of usable ultraviolet-curable resin include acrylic resin and epoxy resin. In order to form the organic flattening layer 19F having a thickness of several micrometers or greater, typically, 10 μm to 20 μm, it is preferred to use a resin of about 10 mPa·s. In order to provide a high level of flatness, it is preferred that the ultraviolet-curable resin has a surface tension of about 20 mN/m to about 40 mN/m. Such an ultraviolet-curable resin may be provided by an inkjet method. The resin is ejected through a nozzle and then is left for several ten seconds to several minutes for levelling. Then, the resin is irradiated with ultraviolet light to be cured, so that the organic flattening layer 19F is formed in a desired region. It is preferred that the organic flattening layer 19F has a high visible light transmittance. It is preferred to use a resin having a transmittance higher than, or equal to, 98% for light having a wavelength of 400 nm, at a thickness of 1 μm.

FIG. 17 is a schematic partial cross-sectional view of a TFE structure 10G in an OLED display device in embodiment 5 according to the present invention.

The TFE structure 10G includes an organic flattening layer 19G and two complex stack bodies 10S1 and 10S2. The organic flattening layer 19G is provided between the two complex stack bodies 10S1 and 10S2. The complex stack body 10S1 includes a first inorganic barrier layer 12G1, an organic barrier layer 14G1 and a second inorganic barrier layer 16G1. The complex stack body 10S2 includes a first inorganic barrier layer 12G2, an organic barrier layer 14G2 and a second inorganic barrier layer 16G2. The complex stack bodies 10S1 and 10S2 each have substantially the same structure as that of the complex stack body 10S (TFE structure 10E) shown in FIG. 14.

Therefore, the moisture tending to enter the organic barrier layer 14G1 through a void 16G1c in the second inorganic barrier layer 16G1 is blocked by an inorganic barrier layer joint portion, where the first inorganic barrier layer 12G1 and the second inorganic barrier layer 16G1 are in direct contact with each other, and thus is suppressed and prevented from reaching the organic barrier layer 14G1. The TFE structure 10G includes the complex stack body 10S2 instead of the inorganic underlying layer 17F included in the TFE structure 10F, and therefore, has a level of moisture-resistance reliability higher than that of the TFE structure 10F.

Figure 18:
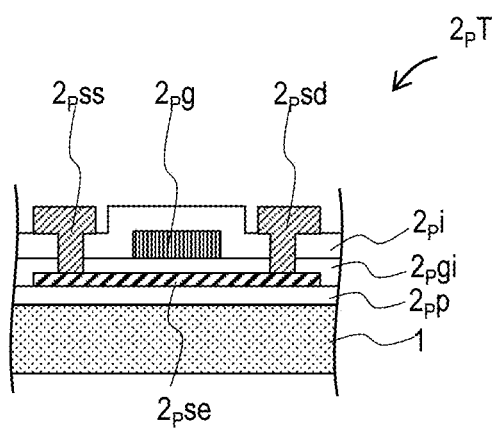
FIG. 18(a) and FIG. 18(b) are each a schematic cross-sectional view of an example of TFT that may be included in the OLED display device in embodiment 1.
Figure 18:
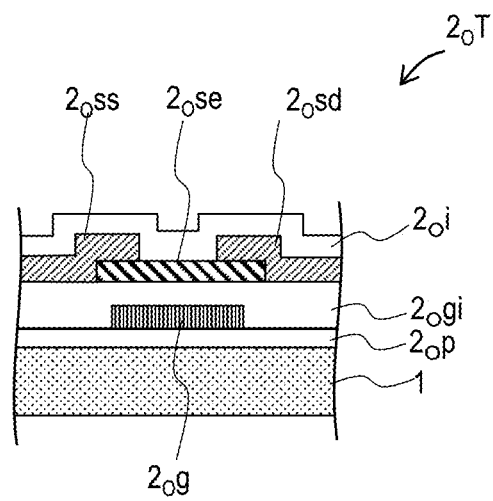
Figure 19:
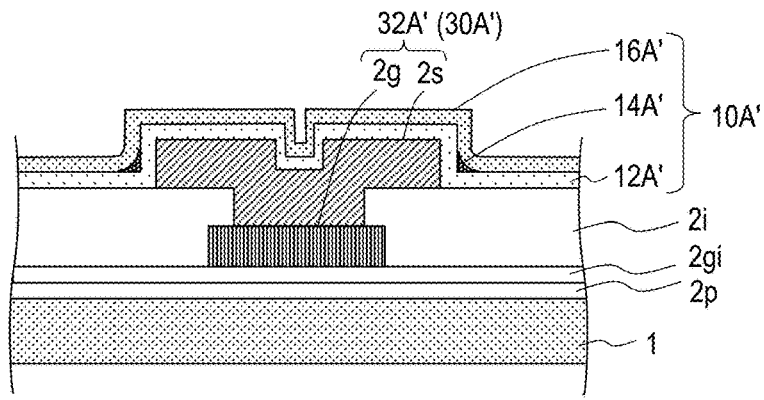
FIG. 19(a) through FIG. 19(d) are schematic cross-sectional views of another OLED display device in embodiment 1, and respectively correspond to FIG. 3(b) through FIG. 3(e).
Figure 19:
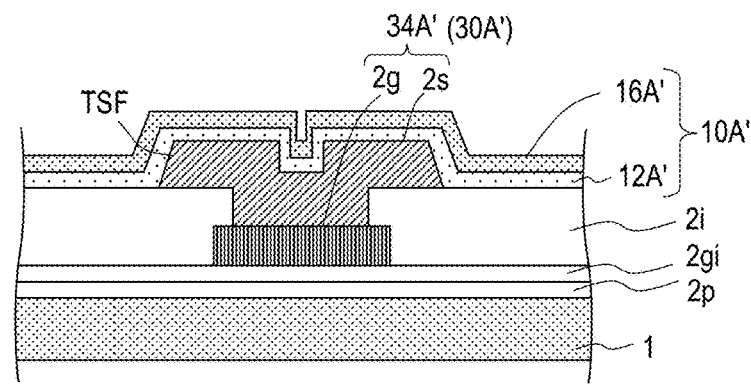
Figure 19:
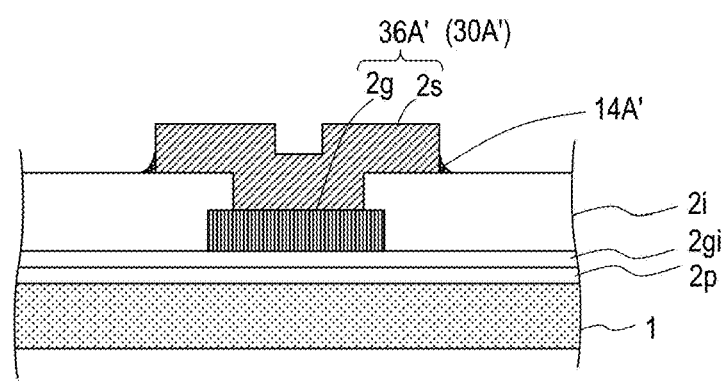
Figure 19:
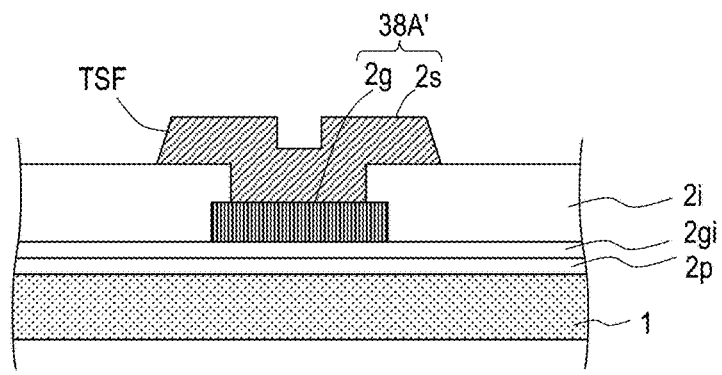

Now, with reference to FIG. 18 and FIG. 19, an example of TFT usable in the OLED display device 100A, and an example of lead wire and terminal formed by use of a gate metal layer and a source metal layer used to form the TFT, will be described. The structures of the TFT, the lead wire and the terminal described below are usable for the OLED display device in any of the above-described embodiments.

For a medium- or small-sized high-definition OLED display device, a high-mobility, low-temperature polycrystalline silicon (hereinafter, referred to simply as "LTPS") TFT or an oxide TFT (e.g., four-component-based (In—Ga—Zn—O-based) oxide TFT containing In (indium), Ga (gallium), Zn (zinc) and O (oxygen)) is preferably used. Structures of, and methods for producing, the LTPS-TFT and the In—Ga—Zn—O-based TFT are well known and will be merely briefly described below.

FIG. 18(a) is a schematic cross-sectional view of an LTPS-TFT $2_pT$. The TFT $2_pT$ may be included in the circuit 2 of the OLED display device 100A. The LTPS-TFT $2_pT$ is a top gate-type TFT.

The TFT $2_pT$ is formed on a base coat $2_pp$ on the substrate (e.g., polyimide film) 1. Although not described above, it is preferred that a base coat formed of an inorganic insulating material is formed on the substrate 1.

The TFT $2_pT$ includes a polycrystalline silicon layer $2_pse$ formed on the base coat $2_pp$, a gate insulating layer $2_pgi$ formed on the polycrystalline silicon layer $2_pse$, a gate electrode $2_pg$ formed on the gate insulating layer $2_pgi$, an interlayer insulating layer $2_pi$ formed on the gate electrode $2_pg$, and a source electrode $2_pss$ and a drain electrode $2_psd$ formed on the interlayer insulating layer $2_pi$. The source electrode $2_pss$ and the drain electrode $2_psd$ are respectively connected with a source region and a drain region of the polycrystalline silicon layer $2_pse$ in contact holes formed in the interlayer insulating layer $2_pi$ and the gate insulating layer $2_pgi$.

The gate electrode $2_pg$ is contained in the gate metal layer containing the gate bus lines, and the source electrode $2_pss$ and the drain electrode $2_psd$ are contained in the source metal layer containing the source bus lines. The gate metal layer and the source metal layer are used to form the lead wires and the terminals (described below with reference to FIG. 19).

The TFT $2_pT$ is formed, for example, as follows.

As the substrate 1, for example, a polyimide film having a thickness of 15 μm is prepared.

The base coat $2_pp$ (SiO$_2$ film: 250 nm/SiN$_x$ film: 50 nm/SiO$_2$ film: 500 nm (top layer/middle layer/bottom layer)) and an a-Si film (40 nm) are formed by plasma CVD.

The a-Si film is subjected to dehydrogenation (e.g., annealed at 450° C. for 180 minutes).

The a-Si film is made polycrystalline-siliconized by excimer laser annealing (ELA).

The a-Si film is patterned by a photolithography step to form an active layer (semiconductor island).

A gate insulating film (SiO$_2$ film: 50 nm) is formed by plasma CVD.

A channel region of the active layer is doped with (B').

The gate metal layer (Mo: 250 nm) is formed by sputtering and patterned by a photolithography step (including a dry etching step) (to form the gate electrode $2p4$, the gate bus lines, and the like).

A source region and a drain region of the active layer are doped with (P$^+$).

Activation annealing (e.g., annealing at 450° C. for 45 minutes) is performed. As a result, the polycrystalline silicon layer $2_pse$ is formed.

An interlayer insulating film (e.g., SiO$_2$ film: 300 nm/SiN$_x$ film: 300 nm (top layer/bottom layer)) is formed by plasma CVD.

The contact holes are formed in the gate insulating film and the interlayer insulating film by dry etching. As a result, the interlayer insulating layer $2_pi$ and the gate insulating layer $2_pgi$ are formed.

The source metal layer (Ti film: 100 nm/Al film: 300 nm/Ti film: 30 nm) is formed by sputtering and patterned by a photolithography step (including a dry etching step) (to form the source electrode $2_pss$, the drain electrode $2_psd$, the source bus lines, and the like).

FIG. 18(b) is a schematic cross-sectional view of an In—Ga—Zn—O-based TFT $2_oT$. The TFT $2_oT$ may be included in the circuit 2 of the OLED display device 100A. The TFT $2_oT$ is a bottom gate-type TFT.

The TFT $2_oT$ is formed on a base coat $2_op$ on the substrate (e.g., polyimide film) 1. The TFT $2_oT$ includes a gate electrode $2_og$ formed on the base coat $2_op$, a gate insulating layer $2_ogi$ formed on the gate electrode $2_og$, an oxide semiconductor layer $2_ose$ formed on the gate insulating layer $2_ogi$, and a source electrode $2_oss$ and a drain electrode $2_osd$ respectively connected with a source region and a drain region of the oxide semiconductor layer $2_ose$. The source electrode $2_oss$ and the drain electrode $2_osd$ are covered with an interlayer insulating layer $2_oi$.

The gate electrode $2_og$ is contained in the gate metal layer containing the gate but lines, and the source electrode $2_osb$ and the drain electrode $2_osd$ are contained in the source metal layer containing the source bus lines. The gate metal layer and the source metal layer are used to form the lead wires and the terminals. As a result, the structure described below with reference to FIG. 19 may be formed.

The TFT $2_oT$ is formed, for example, as follows.

As the substrate 1, for example, a polyimide film having a thickness of 15 μm is prepared.

The base coat $2_op$ (SiO$_2$ film: 250 nm/SiN$_x$ film: 50 nm/SiO$_2$ film: 500 nm (top layer/middle layer/bottom layer)) is formed by plasma CVD.

The gate metal layer (Cu film: 300 nm/Ti film: 30 nm (top layer/bottom layer)) is formed by sputtering and patterned by a photolithography step (including a dry etching step) (to form the gate electrode $2_og$, the gate bus lines, and the like).

A gate insulating film (SiO$_2$ film: 30 nm/SiN$_x$ film: 350 nm (top layer/bottom layer)) is formed by plasma CVD.

An oxide semiconductor film (In—Ga—Z—O-based semiconductor film: 100 nm) is formed by sputtering and patterned by a photolithography step (including a wet etching step) to form an active layer (semiconductor island).

The source metal layer (Ti film: 100 nm/Al film: 300 nm/Ti film: 30 nm (top layer/medium layer/bottom layer)) is formed by sputtering and patterned by a photolithography step (including a dry etching step) (to form the source electrode $2_oss$, the drain electrode $2_osd$, the source bus lines, and the like).

Activation annealing (e.g., annealing at 300° C. for 120 minutes) is performed. As a result, the oxide semiconductor layer $2_ose$ is formed.

After this, the interlayer insulating layer $2_oi$ (e.g., SiN$_x$ film: 300 nm/SiO$_2$ film: 300 nm (top layer/bottom layer)) is formed by plasma CVD as a protection film.

Now, with reference to FIG. 19(a) through FIG. 19(d), a structure of another OLED display device in embodiment 1 will be described. The circuit (back plane circuit) 2 of this OLED display device includes the TFT $2_pT$ shown in FIG. 18(a) or the TFT $2_oT$ shown in FIG. 18(b). The gate metal layer and the source metal layer used to form the TFT $2_pT$ or the TFT $2_oT$ are used to form a lead wire 30A' and a terminal 38A'. FIG. 19(a) through FIG. 19(d) respectively correspond to FIG. 3(b) through FIG. 3(e). Components corresponding to those in FIG. 3(b) through FIG. 3(e) will be represented by the identical reference signs provided with "'" at the end. A base coat $2p$ in FIG. 19 corresponds to the base coat $2_pp$ in FIG. 18(a) and the base coat $2_op$ in FIG. 18(b). A gate insulating layer $2gi$ in FIG. 19 corresponds to the gate insulating layer $2_pgi$ in FIG. 18(a) and the gate insulating layer $2_ogi$ in FIG. 18(b). An interlayer insulating layer $2i$ in FIG. 19 corresponds to the interlayer insulating layer $2_pi$ in FIG. 18(a) and the interlayer insulating layer $2_oi$ in FIG. 18(b).

As shown in FIG. 19(a) through FIG. 19(d), a gate metal layer $2g$ and a source metal layer $2s$ are formed on the base coat $2p$, which is formed on the substrate 1. Although not shown in FIG. 3, it is preferred the base coat $2p$ of an inorganic insulating material is formed on the substrate 1.

With reference to FIG. 19(a) and FIG. 19(b), a structure of a TFE structure 10A' will be described. FIG. 19(a) corresponds to a cross-sectional view taken along line 3B-3B' in FIG. 2, and is a cross-sectional view of a portion 32A', of the lead wire 30A', corresponding to the active region. FIG. 19(b) corresponds to a cross-sectional view taken along line 3C-3C' in FIG. 2, and is a cross-sectional view of a portion 34A' having a forward tapering side surface portion (inclining side surface portion) TSF having a tapering angle smaller than 90 degrees.

As shown in FIG. 19(a) through FIG. 19(c), the lead wire 30A' is formed as a stack body of the gate metal layer $2g$ and the source metal layer $2s$. A portion of lead wire 30A' that is formed of the gate metal layer $2g$ has, for example, the same cross-sectional shape as that of the gate bus line. A portion of the lead wire 30A' that is formed of the source metal layer $2s$ has, for example, the same cross-sectional shape as that of the source bus line. In a case of, for example, a 5.7-type display device of 500 ppi, the portion formed of the gate metal layer $2g$ has a line width of, for example, 10 μm, and a distance between two adjacent such lines is 16 μm (L/S=10/16). The portion formed of the source metal layer $2s$ has a line width of, for example, 16 μm, and a distance between two adjacent such lines is 10 μm (L/S=16/10).

Referring to FIG. 19(a), the portion 32A', of the lead wire 30A', corresponding to the active region has side surfaces each having a tapering angle of about 90 degrees in a cross-section parallel to the line width direction, like the gate bus line or the source bus line. An organic barrier layer (solid portion) 14A' is formed on a lowermost portion of the first inorganic barrier layer 12A' covering the portion 32A' of the lead wire 30A' (at the border between a portion covering each of side surfaces of the lead wire 30A' and a portion formed on the flat portion of the substrate 1).

By contrast, referring to FIG. 19(b), the portion 34A' of the lead wire 30A' has a forward tapering side surface portion (inclining side surface portion) TSF having a tapering angle smaller than 90 degrees. On the portion 34A', of the lead wire 30A', having the forward tapering side surface portion TSF, the organic barrier layer (solid portion) 14A' is not present and the first inorganic barrier layer 12A' and the second inorganic barrier layer 16A' are in direct contact with each other (namely, an inorganic barrier layer joint portion is formed). The organic barrier layer (solid portion) 14A' is not formed on the flat portion, either. Therefore, the lead wire 30A' is covered with the inorganic barrier layer joint portion, where the first inorganic barrier layer 12A' and the second inorganic barrier layer 16A' are in direct contact with each other, in the cross-section taken along line 3C-3C' in FIG. 2.

Now, FIG. 19(c) and FIG. 19(d) will be referred to. FIG. 19(a) and FIG. 19(d) are each a cross-sectional view of a region where the TFE structure 10A' is not formed. A portion 36A' of the lead wire 30A' shown in FIG. 19(c) has substantially the same cross-sectional shape as that of the portion 32A' of the lead wire 30A' shown in FIG. 19(a). The organic barrier layer 14A' is formed on a lowermost portion of each of the side surfaces of the portion 36A'. The terminal 38A' shown in FIG. 19(d) has substantially the same cross-sectional shape as that of the portion 34A' of the lead wire 30A' shown in FIG. 19(b), and has a forward tapering side surface portion TSF having a tapering angle smaller than 90 degrees. Therefore, the organic barrier layer (solid portion) 14A' is not present on the side surfaces of the terminal 38A'. The organic barrier layer (solid portion) 14A' is not present on the flat portion, either.

In the example shown in FIG. 19(b), the entirety of each of the two side surfaces of the lead wire 30A' that are in contact with the first inorganic barrier layer 12A' is the forward tapering side surface portion TSF. As described above with reference to FIG. 5(b), it is sufficient that each of the two side surfaces in contact with the first inorganic barrier layer 12A' has the forward tapering side surface portion TSF at least at a lowermost portion thereof. With such a structure, the photocurable resin is prevented from being locally present, and the non-solid portion is formed. Similarly, in the example shown in FIG. 19(d), the entirety of each of all the exposed side surfaces of the terminal 38A' is a forward tapering side surface portion TSF. However, the above-described effect is provided as long as each of all the exposed side surfaces has the forward tapering side surface portion at least at a lowermost portion thereof.

Now, with reference to FIG. 20(a) and FIG. 20(b), the film formation device 200 usable to form an organic barrier layer, and a film formation method using the same, will be described. FIG. 20(a) and FIG. 20(b) schematically show a structure of the film formation device 200. FIG. 20(a) shows a state of the film formation device 200 in a step of, in a chamber having a vapor-like or mist-like photocurable resin located therein, condensing a photocurable resin on the first inorganic barrier layer. FIG. 20(b) shows a state of the film formation device 200 in a step of irradiating the photocurable resin with light to which the photocurable resin is sensitive and thus curing the photocurable resin.

The film formation device 200 includes a chamber 210 and a partition wall 234 dividing the inside of the chamber 210 into two spaces. In one of the spaces demarcated by the partition wall 234, a stage 212 and a shower plate 220 are located. In the other space demarcated by the partition wall 234, an ultraviolet light irradiation device 230 is located. The inner space of the chamber 210 is controlled to have a predetermined pressure (vacuum degree) and a predetermined temperature. The stage 212 has a top surface that receives an element substrate 20 including a plurality of the OLEDs 3, on which the first inorganic barrier layer is formed. The top surface may be cooled down to, for example, −20° C.

The shower plate 220 is located to have a gap 224 between the shower plate 220 and the partition wall 234. The shower plate 220 has a plurality of through-holes 222. The gap 224 may have a size of, for example, 100 mm or longer and 1000 mm or shorter in a vertical direction. An acrylic monomer (in a vapor or mist state) supplied to the gap 224 is supplied, via the plurality of through-holes 222 of the shower plate 220, to one of the spaces of the chamber 210 in which the stage 212 is located. As necessary, the acrylic monomer is heated. A vapor-like or mist-like acrylic monomer 26p is attached to, or contacts, the first inorganic barrier layer on the element substrate 20. An acrylic monomer 26 is supplied from a container 202 into the chamber 210 at a predetermined flow rate. The container 202 is supplied with the acrylic monomer 26 via a pipe 206 and also is supplied with nitrogen gas from a pipe 204. The flow rate of the acrylic monomer supplied to the container 202 is controlled by a mass flow controller 208. A material supply device includes the shower plate 220, the container 202, the pipes 204 and 206, the mass flow controller 208 and the like.

The ultraviolet light irradiation device 230 includes an ultraviolet light source and an optional optical element. The ultraviolet light source may be, for example, an ultraviolet lamp (e.g., mercury lamp (encompassing a high-pressure lamp and a super-high pressure lamp), a mercury-xenon lamp or a metal halide lamp). Alternatively, the ultraviolet light source may be an ultraviolet light emitting semiconductor element such as an ultraviolet LED, an ultraviolet semiconductor laser or the like. The optical element encompasses, for example, a reflective mirror, a prism, a lens, an optical fiber, a diffractive element, a spatial modulation element, and a hologram. A beam output from, for example, the ultraviolet laser is shaped by use of any of various known optical elements. For example, a beam having a line-like cross-sectional shape may be formed. A plurality of ultraviolet light sources may be used in the case where the ultraviolet light sources are of a certain type or a certain size. For example, a plurality of semiconductor lasers may be located in one line or in a two-dimensional array. One, or two or more, laser beams may be scanned.

The ultraviolet light irradiation device 230, when being located at a predetermined position, directs light having a predetermined wavelength and a predetermined intensity toward the top surface of the stage 212. It is preferred that the partition wall 234 and the shower plate 220 are formed of a material having a high ultraviolet light transmittance, for example, quartz.

Figure 4:
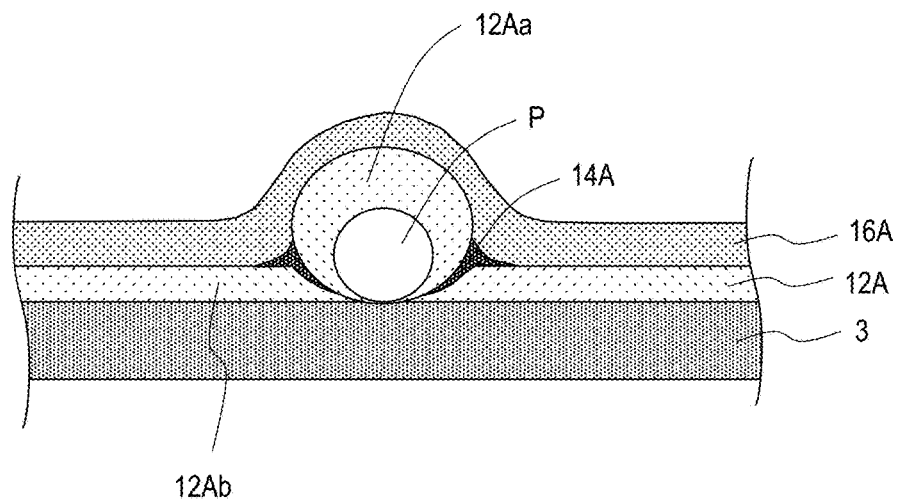
FIG. 4(a) is a partial enlarged view of a portion including a particle P.
FIG. 4(b) is a schematic plan view showing the size relationship among the particle P, a first inorganic barrier layer (SiN layer) covering the particle P, and an organic barrier layer.
Figure 4:
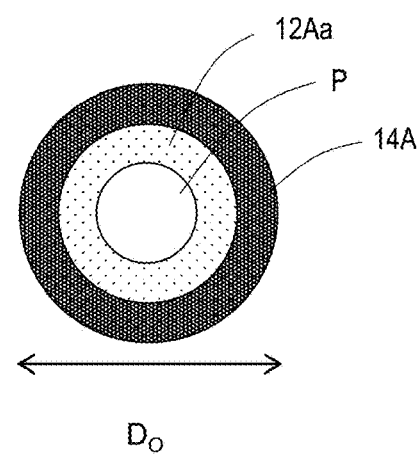
Figure 4:
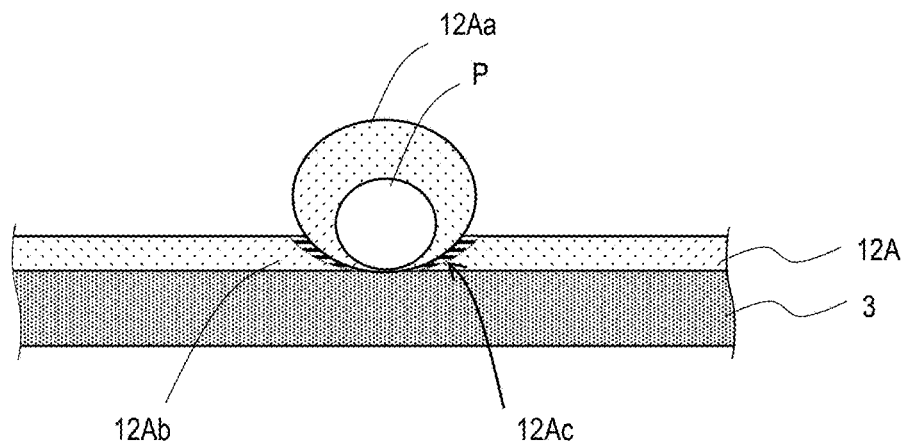
Figure 5:
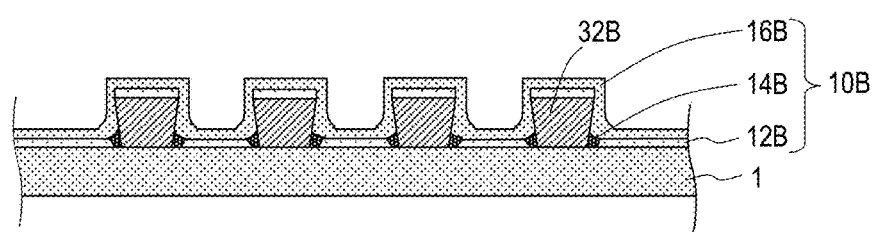
FIG. 5(a) and FIG. 5(b) are respectively schematic partial cross-sectional views of TFE structures 10B and 10C included in other OLED display devices in embodiment 1.
Figure 5:
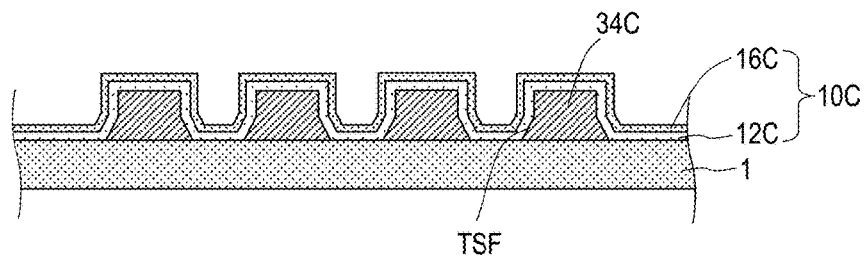

The organic barrier layer 14A shown in FIG. 4 or the organic barrier layer 14D shown in FIG. 6 may be formed, for example, as follows by use of the film formation device 200. In this example, an acrylic monomer is used as the photocurable resin.

The acrylic monomer 26p is supplied into the chamber 210. The element substrate 20 has been cooled to, for example, −15° C. on the stage 212. The acrylic monomer 26p is condensed on the first inorganic barrier layer 12A or 12D on the element substrate 20. The conditions in this step may be controlled such that the acrylic monomer in a liquid state is present locally, more specifically, only around the protruding portion of the first inorganic barrier layer 12A. Alternatively, in the case where the organic barrier layer 14D shown in FIG. 6 is to be formed, the conditions may be controlled such that the acrylic monomer condensed on the first inorganic barrier layer 12D forms a liquid film.

The viscosity and/or the surface tension of the photocurable resin in the liquid state may be adjusted to control the thickness of the liquid film or the shape of the portion of the liquid film that is to be in contact with the protruding portion of the first inorganic barrier layer 12A or 12D (namely, the shape of the recessed portion). For example, the viscosity and the surface tension depend on the temperature. Therefore, the temperature of the element substrate may be adjusted to control the viscosity and the surface tension. In the case where the organic barrier layer 14D shown in FIG. 6 is to be formed, the size of the solid portion present on the flat portion may be controlled by the shape of a portion of the liquid film that is to be in contact with the protruding portion of the first inorganic barrier layer 12D (namely, the shape of the recessed portion) and by the conditions of ashing to be performed in a later step.

Next, the acrylic monomer on the first inorganic barrier layer 12A or 12D is cured by use of the ultraviolet light irradiation device 230, typically, by directing ultraviolet light 232 toward the entirety of a top surface of the element substrate 20. As the ultraviolet light source, for example, a high pressure mercury lamp that provides light having a main peak at 365 nm is used. The ultraviolet light is directed at an intensity of, for example, 12 mW/cm$^2$ for about 10 seconds.

The organic barrier layer 14A of an acrylic resin is formed in this manner. The tact time of the step of forming the organic barrier layer 14A is shorter than about 30 seconds. Thus, the mass-productivity is very high.

By contrast, the organic barrier layer 14D is formed after the photocurable resin in the liquid state is cured and ashing is performed as described above with reference to FIG. 9. The ashing may be performed also to form the organic barrier layer 14A. The ashing may improve the adhesiveness between the organic barrier layer 14A and the second inorganic barrier layer 16A.

After the above, the resultant body is transported to a CVD chamber in order to form the second inorganic barrier layer 16A or 16D. The second inorganic barrier layer 16A or 16D is formed under, for example, the same conditions for the first inorganic barrier layer 12A or 12D. The second inorganic barrier layer 16A or 16D is formed in the region where the first inorganic barrier layer 12A or 12D is formed. Therefore, the inorganic barrier layer joint portion, where the first inorganic barrier layer 12A or 12D and the second inorganic barrier layer 16A or 16D are in direct contact with each other, is formed in the non-solid portion of the organic barrier layer 14A or 14D. Therefore, as described above, the water vapor in the air is suppressed or prevented from reaching the inside of the active region via the organic barrier layer.

The first inorganic barrier layer 12D and the second inorganic barrier layer 16D are formed, for example, as follows. An inorganic barrier layer having a thickness of 400 nm may be formed by plasma CVD using $SiH_4$ gas and $N_2O$ gas, at a film formation rate of 400 nm/min, in a state where, for example, the temperature of the substrate (the OLED 3) on which the film is to be formed is controlled to be lower than, or equal to, 80° C. The inorganic barrier layer thus formed has a refractive index of 1.84 and a 400 nm visible light transmittance of 90% (thickness: 400 nm). The film stress has an absolute value of 50 MPa.

The inorganic barrier layer may be an SiO layer, an SiON layer, an SiNO layer, an $Al_2O_3$ layer or the like as well as an SiN layer. The photocurable resin contains, for example, a vinyl group-containing monomer. Among various types of vinyl group-containing monomer, an acrylic monomer is preferably usable. The acrylic monomer may be mixed with a photoinitiator when necessary. Any of various known acrylic monomers is usable. A plurality of acrylic monomers may be mixed. For example, a bifunctional monomer and a trifunctional or higher-level multi-functional monomer may be mixed. An oligomer may be mixed. An ultraviolet-curable silicone resin may be used as the photocurable resin. A silicone resin (encompassing silicone rubber) is superb in the visible light transmittance and the climate resistance, and has a feature of not being easily yellowed even after being used for a long time. A photocurable resin curable by being irradiated with visible light may be used. The viscosity of the photocurable resin in a pre-cured state at room temperature (e.g., 25° C.) preferably does not exceed 10 Pa·s, and especially preferably is 1 to 100 mPa·s. In the case where the viscosity is too high, it may be difficult to form a thin liquid film having a thickness less than, or equal to, 500 nm.

In the above, an OLED display device including a flexible substrate and a method for producing the same in an embodiment are described. An embodiment of the present invention is not limited to any of the devices or methods described above. An embodiment of the present invention is also widely applicable to an organic EL device including an organic EL element formed on a non-flexible substrate (e.g., glass substrate) and a thin film encapsulation structure formed on the organic EL element (for example, applicable to an organic EL illumination device).

INDUSTRIAL APPLICABILITY

An embodiment of the present invention is usable for an organic EL device and a method for producing the same. An embodiment of the present invention is especially preferably usable for a flexible organic EL display device and a method for producing the same.

REFERENCE SIGNS LIST

1: Substrate (flexible substrate)
2: Circuit (driving circuit or back plane)
3: Organic EL element
4: Polarization plate
10, 10A, 10B, 10C, 10D: Thin film encapsulation structure (TFE structure)
12, 12A, 12B, 12C, 12D: First inorganic barrier layer (SiN layer)
14, 14A, 14B, 14D: Organic barrier layer (acrylic resin layer)
14Ds: Surface of the organic barrier layer (post-ashing)
14Dsa: Surface of the organic barrier layer (pre-ashing)

16A, 16B, 16C, 16D: Second inorganic barrier layer (SiN layer)
16Dc: Void
16Dd: Recessed portion
20: Element substrate
26: Acrylic monomer
26p: Vapor-like or mist like acrylic monomer
100, 100A: Organic EL display device

The invention claimed is:

1. An organic electroluminescent device, comprising:
an element substrate including a substrate and a plurality of organic electroluminescent elements supported by the substrate; and
a thin film encapsulation structure formed on the plurality of organic electroluminescent elements;
wherein:
the thin film encapsulation structure includes at least one complex stack body including:
a first inorganic barrier layer,
an organic barrier layer in contact with a top surface of the first inorganic barrier layer, the organic barrier layer including a plurality of solid portions discretely distributed, and
a second inorganic barrier layer in contact with the top surface of the first inorganic barrier layer and a top surface of each of the plurality of solid portions of the organic barrier layer; and
the plurality of solid portions include a plurality of first island-like solid portions discretely provided and each having a recessed surface and a plurality of second island-like solid portions formed on a flat portion, wherein
the plurality of first island-like solid portions and the plurality of second island-like solid portions have oxidized surfaces.

2. The organic electroluminescent device of claim 1, wherein the plurality of first island-like solid portions include a plurality of ring-shaped island-like solid portions having a diameter longer than or equal to 2 μm converted into a diameter of a circle, as seen in a direction normal to the substrate, and, among the plurality of first island-like solid portions and the plurality of second island-like solid portions, two island-like solid portions adjacent to each other are away from each other by a distance longer than, or equal to, 2 mm.

3. The organic electroluminescent device of claim 1, further comprising:
a driving circuit supported by the substrate;
a plurality of terminals located in a peripheral region; and
a plurality of lead wires connecting the driving circuit and the plurality of terminals to each other;
wherein:
the thin film encapsulation structure is provided on a portion of each of the plurality of lead wires that corresponds to the driving circuit, and includes, on the portion of each of the lead wires, an inorganic barrier layer joint portion, where the organic barrier layer is not present and the first inorganic barrier layer and the second inorganic barrier layer are in direct contact with each other.

4. The organic electroluminescent device of claim 3, wherein at least a portion of each of the plurality of lead wires has, at least at a lowermost portion of each of two side surfaces in contact with the first inorganic barrier layer, a forward tapering side surface portion having a tapering angle smaller than 90 degrees in a cross-section parallel to a line width direction; and the inorganic barrier layer joint portion is provided on the portion of each of the lead wires that has the forward tapering side surface portion.

5. The organic electroluminescent device of claim 3, wherein the inorganic barrier layer joint portion has a length of at least 0.01 mm.

6. The organic electroluminescent device of claim 1, wherein the organic barrier layer is formed of a photocurable resin.

7. The organic electroluminescent device of claim 1, wherein the organic barrier layer has a thickness less than 500 nm.

8. The organic electroluminescent device of claim 1, wherein the first inorganic barrier layer and the second inorganic barrier layer are each independently an SiN layer having a thickness of 200 nm or greater and 1000 nm or less.

9. The organic electroluminescent device of claim 1, wherein:
the thin film encapsulation structure further includes an inorganic underlying layer and an organic flattening layer formed on the inorganic underlying layer; and
the at least one complex stack body is formed in contact with a top surface of the organic flattening layer.

10. The organic electroluminescent device of claim 1, wherein:
the thin film encapsulation structure further includes an organic flattening layer;
the at least one complex stack body includes two complex stack bodies; and
the organic flattening layer is formed between the two complex stack bodies.

* * * * *